United States Patent
Kimba

(10) Patent No.: US 9,561,577 B2
(45) Date of Patent: Feb. 7, 2017

(54) POLISHING METHOD AND POLISHING APPARATUS

(71) Applicant: EBARA CORPORATION, Tokyo (JP)

(72) Inventor: Toshifumi Kimba, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 671 days.

(21) Appl. No.: 13/658,070

(22) Filed: Oct. 23, 2012

(65) Prior Publication Data

US 2013/0109278 A1  May 2, 2013

(30) Foreign Application Priority Data

Oct. 26, 2011 (JP) ................................. 2011-235024
Oct. 5, 2012 (JP) ................................. 2012-222682

(51) Int. Cl.
 *B24B 49/00* (2012.01)
 *B24B 49/04* (2006.01)
 *B24B 37/013* (2012.01)
 *B24B 49/12* (2006.01)

(52) U.S. Cl.
 CPC ............ *B24B 49/04* (2013.01); *B24B 37/013* (2013.01); *B24B 49/12* (2013.01)

(58) Field of Classification Search
 CPC ......... B24B 37/013; B24B 49/04; B24B 49/12
 USPC .......................................................... 451/5
 See application file for complete search history.

(56) References Cited

U.S. PATENT DOCUMENTS

| | | | |
|---|---|---|---|
| 5,695,660 A * | 12/1997 | Litvak .............................. | 216/85 |
| 6,785,010 B2 | 8/2004 | Kimba et al. | |
| 7,252,575 B2 | 8/2007 | Kobayashi et al. | |
| 2002/0115380 A1* | 8/2002 | Yamane et al. .................... | 451/6 |
| 2004/0016895 A1* | 1/2004 | Amartur .................. | 250/559.27 |
| 2004/0117146 A1* | 6/2004 | Liu et al. ....................... | 702/172 |
| 2004/0235392 A1* | 11/2004 | Ohta ..................... | B24B 37/205 451/6 |
| 2007/0148792 A1* | 6/2007 | Marx ..................... | H01L 22/12 438/14 |
| 2009/0174017 A1* | 7/2009 | Sumi ............................ | 257/431 |

(Continued)

FOREIGN PATENT DOCUMENTS

| | | |
|---|---|---|
| JP | 10-125634 | 5/1998 |
| JP | 2000-009437 | 1/2000 |

(Continued)

*Primary Examiner* — Mohammad Ali
*Assistant Examiner* — Yuhui R Pan
(74) *Attorney, Agent, or Firm* — Wenderoth, Lind & Ponack, L.L.P.

(57) ABSTRACT

A polishing method capable of obtaining an accurate thickness of a silicon layer during polishing of a substrate and determining an accurate polishing end point of the substrate based on the thickness of the silicon layer obtained. The method includes: calculating relative reflectance by dividing the measured intensity of the infrared ray by predetermined reference intensity; producing spectral waveform representing relationship between the relative reflectance and wavelength of the infrared ray; performing a Fourier transform process on the spectral waveform to determine a thickness of the silicon layer and a corresponding strength of frequency component; and determining a polishing end point of the substrate based on a point of time when the determined thickness of the silicon layer has reached a predetermined target value.

23 Claims, 18 Drawing Sheets

(56) References Cited

U.S. PATENT DOCUMENTS

2010/0093260 A1\* 4/2010 Kobayashi et al. .............. 451/5

FOREIGN PATENT DOCUMENTS

| JP | 2004-154928 | 6/2004 |
| JP | 2005-081518 | 3/2005 |
| JP | 2009-050944 | 3/2009 |
| JP | 2010-016016 | 1/2010 |

\* cited by examiner

FIG. 7

| | 1-st ROTATION | | 2-nd ROTATION | | 3-rd ROTATION | | 4-th ROTATION | | 5-th ROTATION | |
|---|---|---|---|---|---|---|---|---|---|---|
| THICKNESS | STRENGTH | EVALUATION | THICKNESS | STRENGTH | EVALUATION | THICKNESS | STRENGTH | EVALUATION | THICKNESS | STRENGTH | EVALUATION |
| 4299 | 1.8 | ○ | 4191 | 1.8 | ○ | 3987 | 1.6 | ○ | 5634 | 0.5 | × | 2122 | 0.2 | × |
| 4059 | 1.4 | ○ | 3902 | 1.8 | ○ | 43554 | 0.3 | × | 9541 | 0.6 | × | 4087 | 1.9 | ○ |
| 1059 | 0.5 | × | 5009 | 0.3 | ○ | 4102 | 1.6 | ○ | 4023 | 1.7 | ○ | 3852 | 1.6 | ○ |
| 3899 | 1.5 | ○ | 4211 | 1.7 | ○ | 3940 | 1.6 | ○ | 3866 | 1.7 | ○ | 3902 | 0.7 | × |
| 4030 | 1.8 | ○ | 3840 | 1.4 | ○ | 1230 | 0.4 | × | 3911 | 1.3 | ○ | 1951 | 0.3 | × |

POLISHING METHOD AND POLISHING APPARATUS

CROSS REFERENCE TO RELATED APPLICATIONS

This application claims priorities to Japanese Patent Application No. 2011-235024 filed on Oct. 26, 2011 and Japanese Patent Application No. 2012-222682 filed on Oct. 5, 2012, the entire contents of which hereby incorporated by reference.

BACKGROUND OF THE INVENTION

Field of the Invention

The present invention relates to a method and an apparatus for polishing a substrate having a silicon layer forming a surface thereof, and more particularly to a polishing method and a polishing apparatus capable of detecting a polishing end point of the substrate based on optical information contained in reflected light from the substrate.

Description of the Related Art

Semiconductor devices are fabricated through several processes including a process of polishing a dielectric film, e.g., $SiO_2$, and a process of polishing a metal film, e.g., copper or tungsten. A fabrication process of backside illumination CMOS sensor includes a process of polishing a silicon layer (silicon wafer), in addition to the polishing processes of the dielectric film and the metal film. The backside illumination CMOS sensor is an image sensor using BSI (backside illumination) technique and has a light-receiving surface constituted by the silicon layer. A fabrication process of through-silicon via (TSV) also includes a process of polishing a silicon layer. The through-silicon via is an electrode constructed by metal, such as copper, formed in a hole passing through the silicon layer.

Polishing of the silicon layer is terminated when its thickness has reached a predetermined target value. CMP (Chemical Mechanical Polishing) apparatus is used for polishing the silicon layer. FIG. 1 is a schematic view of the CMP apparatus. The CMP apparatus includes a polishing table 101 with a polishing pad 100 attached to an upper surface thereof, a top ring 110 for holding a wafer W, a slurry supply unit 115 for supplying a polishing liquid (slurry) onto the polishing pad 100, and a film-thickness measuring device 120 for measuring a film thickness of the wafer W. The film-thickness measuring device 120 is embedded in the polishing table 101.

The top ring 110 and the polishing table 101 rotate as indicated by arrows. In this state, the top ring 110 presses the wafer W against the polishing pad 110, while the slurry supply unit 115 supplies the polishing liquid onto the polishing pad 110. The wafer W is polished by sliding contact with the polishing pad 110 in the presence of the polishing liquid. During polishing of the wafer W, the film-thickness measuring device 120 rotates together with the polishing table 101 and measures the film thickness while sweeping a surface of the wafer W. Polishing of the wafer W is terminated when the film thickness has reached the predetermined target value.

An optical film-thickness measuring device is one example of the film-thickness measuring device 120 used in the above-described CMP apparatus. This optical film-thickness measuring device is designed to direct light to the surface of the wafer and analyze reflected light from the wafer to determine a thickness of a film formed on the surface of the wafer. Silicon (Si) has a larger refractive index than that of dielectric material, such as $SiO_2$, and hardly allows visible light to pass therethrough. Thus, instead of the visible light, infrared ray, which has a good permeability, is used in measuring of the thickness of the silicon layer.

The film-thickness measuring device using the infrared ray can measure the thickness of the silicon layer. However, the film-thickness measuring device incorporated in the CMP apparatus may fail to measure the thickness if there is a variation in the thickness of the silicon layer because it measures the thickness of the silicon layer while the device itself is moving as shown in FIG. 1. In particular, the silicon layers that have been polished in the above-mentioned BSI fabrication process and the TSV fabrication process have a polished surface with low flatness, which is likely to cause the failure of measurement. One possible solution to such measurement failure is to shorten a measuring time per one measuring operation. However, in this case, a quantity of the reflected infrared ray is reduced and as a result S/N ratio is lowered. This makes it difficult to achieve accurate measurement. Moreover, since the silicon layer is scraped away every time the polishing table makes one revolution, it is impossible to measure the thickness at the same position under the same conditions.

SUMMARY OF THE INVENTION

The present invention has been made in order to solve the above drawbacks. It is therefore an object of the present invention to provide a polishing method and a polishing apparatus capable of obtaining an accurate thickness of the silicon layer (or a film formed on the substrate) during polishing of the substrate (e.g., wafer) and capable of accurately determining a substrate polishing end point based on the thickness of the silicon layer obtained.

One aspect of the present invention for achieving the above object provides a method of polishing a substrate having a silicon layer. The method includes: polishing the substrate by pressing the substrate against a polishing tool on a rotating polishing table; irradiating the substrate with infrared ray when polishing the substrate, receiving the infrared ray reflected from the substrate; measuring intensity of the reflected infrared ray at respective wavelengths; calculating relative reflectance by dividing the measured intensity of the infrared ray by predetermined reference intensity; producing spectral waveform representing relationship between the relative reflectance and wavelength of the infrared ray; performing a Fourier transform process on the spectral waveform to determine a thickness of the silicon layer and a corresponding strength of frequency component; and determining a polishing end point of the substrate based on a point of time when the determined thickness of the silicon layer has reached a predetermined target value.

Another aspect of the present invention provides a method of polishing a substrate having a film formed on a surface thereof. The method includes: polishing the substrate by pressing the substrate against a polishing tool on a rotating polishing table; irradiating the substrate with light when polishing the substrate, receiving the light reflected from the substrate; measuring intensity of the reflected light at respective wavelengths; calculating relative reflectance by dividing the measured intensity of the light by predetermined reference intensity; producing spectral waveform representing relationship between the relative reflectance and wavelength of the light; performing a Fourier transform process on the spectral waveform to determine a thickness of the film and a corresponding strength of frequency component; identifying the determined thickness of the film as a reliable measured value if the determined strength of the frequency component is higher than a predetermined threshold value and/or the determined thickness of the film is within a predetermined range; and determining a polishing end point of the substrate based on a point of time when the reliable measured value has reached a predetermined target value. The threshold value is determined based on frequency distribution of the strength of the frequency component that has been obtained previously.

Another aspect of the present invention provides a method of polishing a substrate having a film formed on a surface thereof. The method includes: polishing the substrate by pressing the substrate against a polishing tool on a rotating polishing table; irradiating the substrate with light when polishing the substrate, receiving the light reflected from the substrate; measuring intensity of the reflected light at respective wavelengths; calculating relative reflectance by dividing the measured intensity of the light by predetermined reference intensity; producing spectral waveform representing relationship between the relative reflectance and wavelength of the light; performing a Fourier transform process on the spectral waveform to obtain relationship between thickness of the film and strength of frequency component and to determine the thickness of the film; identifying the determined thickness of the film as a reliable measured value if a strength of the frequency component at a predetermined observation thickness is lower than a predetermined threshold value; and determining a polishing end point of the substrate based on a point of time when the reliable measured value has reached a predetermined target value.

Another aspect of the present invention provides a method of polishing a substrate having a film formed on a surface thereof. The method includes: polishing the substrate by pressing the substrate against a polishing tool on a rotating polishing table; irradiating the substrate with light when polishing the substrate, receiving the light reflected from the substrate; measuring intensity of the reflected light at respective wavelengths; calculating relative reflectance by dividing the measured intensity of the light by predetermined reference intensity; producing spectral waveform representing relationship between the relative reflectance and wavelength of the light; performing a Fourier transform process on the spectral waveform to obtain relationship between thickness of the film and strength of frequency component and to determine the thickness of the film and a corresponding strength of frequency component; identifying the determined thickness of the film as a reliable measured value if an absolute value of a difference between a strength of the frequency component at a predetermined observation thickness and the determined strength of frequency component is larger than a predetermined threshold value; and determining a polishing end point of the substrate based on a point of time when the reliable measured value has reached a predetermined target value.

Another aspect of the present invention provides an apparatus for polishing a substrate having a silicon layer. The apparatus includes: a rotatable polishing table for supporting a polishing tool thereon; a top ring configured to press the substrate against the poling tool on the rotating polishing table; an irradiator configured to irradiate the substrate with infrared ray when the substrate is held by the top ring; an optical receiver configured to receive the infrared ray reflected from the substrate; a spectroscope configured to measure intensity of the reflected infrared ray at respective wavelengths; and a polishing monitoring unit configured to determine a thickness of the silicon layer from infrared-ray intensity data obtained by the spectroscope. The polishing monitoring unit configured to calculate relative reflectance by dividing the measured intensity of the infrared ray by predetermined reference intensity, produce spectral waveform representing relationship between the relative reflectance and wavelength of the infrared ray, perform a Fourier transform process on the spectral waveform to determine a thickness of the silicon layer and a corresponding strength of frequency component, and determine a polishing end point of the substrate based on a point of time when the determined thickness of the silicon layer has reached a predetermined target value.

Another aspect of the present invention provides an apparatus for polishing a substrate having a film formed on a surface thereof. The apparatus includes: a rotatable polishing table for supporting a polishing tool thereon; a top ring configured to press the substrate against the poling tool on the rotating polishing table; an irradiator configured to irradiate the substrate with light when the substrate is held by the top ring; an optical receiver configured to receive the light reflected from the substrate; a spectroscope configured to measure intensity of the reflected light at respective wavelengths; and a polishing monitoring unit configured to determine a thickness of the film from light intensity data obtained by the spectroscope. The polishing monitoring unit configured to calculate relative reflectance by dividing the measured intensity of the light by predetermined reference intensity, produce spectral waveform representing relationship between the relative reflectance and wavelength of the light, perform a Fourier transform process on the spectral waveform to determine a thickness of the film and a corresponding strength of frequency component, identify the determined thickness of the film as a reliable measured value if the determined strength of the frequency component is higher than a predetermined threshold value and/or the determined thickness of the film is within a predetermined range, and determine the polishing end point of the substrate based on a point of time when the reliable measured value has reached the predetermined target value. The threshold value is determined based on frequency distribution of the strength of the frequency component produced by a plurality of measured values that have been obtained previously.

Another aspect of the present invention provides an apparatus for polishing a substrate having a film formed on a surface thereof. The apparatus includes: a rotatable polishing table for supporting a polishing tool thereon; a top ring configured to press the substrate against the poling tool on the rotating polishing table; an irradiator configured to irradiate the substrate with light when the substrate is held by the top ring; an optical receiver configured to receive the light reflected from the substrate; a spectroscope configured to measure intensity of the reflected light at respective wavelengths; and a polishing monitoring unit configured to determine a thickness of the film from light intensity data obtained by the spectroscope. The polishing monitoring unit configured to calculate relative reflectance by dividing the measured intensity of the light by predetermined reference intensity, produce spectral waveform representing relationship between the relative reflectance and wavelength of the light, perform a Fourier transform process on the spectral waveform to obtain relationship between thickness of the film and strength of frequency component and to determine the thickness of the film, identify the determined thickness of the film as a reliable measured value if a strength of the frequency component at a predetermined observation thickness is lower than a predetermined threshold value, and determine the polishing end point of the substrate based on a point of time when the reliable measured value has reached the predetermined target value.

Another aspect of the present invention provides an apparatus for polishing a substrate having a film formed on a surface thereof. The apparatus includes: a rotatable polishing table for supporting a polishing tool thereon; a top ring configured to press the substrate against the poling tool on the rotating polishing table; an irradiator configured to irradiate the substrate with light when the substrate is held by the top ring; an optical receiver configured to receive the light reflected from the substrate; a spectroscope configured to measure intensity of the reflected light at respective wavelengths; and a polishing monitoring unit configured to determine a thickness of the film from light intensity data obtained by the spectroscope. The polishing monitoring unit configured to calculate relative reflectance by dividing the measured intensity of the light by predetermined reference intensity, produce spectral waveform representing relationship between the relative reflectance and wavelength of the light, perform a Fourier transform process on the spectral waveform to obtain relationship between thickness of the film and strength of frequency component and to determine the thickness of the film and a corresponding strength of frequency component, identify the determined thickness of the film as a reliable measured value if an absolute value of a difference between a strength of the frequency component at a predetermined observation thickness and the determined strength of frequency component is larger than a predetermined threshold value, and determine the polishing end point of the substrate based on a point of time when the reliable measured value has reached the predetermined target value.

According to the present invention, the reliable measured value, which is a measured value accurately reflecting the thickness of the silicon layer (or the film formed on the surface of the substrate), is obtained. Therefore, an accurate polishing end point can be detected based on the measured value obtained.

BRIEF DESCRIPTION OF THE DRAWINGS

FIG. 7 is a table showing measurement data obtained when polishing a wafer having backside illumination (BSI) image sensor formed thereon;

DETAILED DESCRIPTION OF THE PREFERRED EMBODIMENTS

Figure 1:
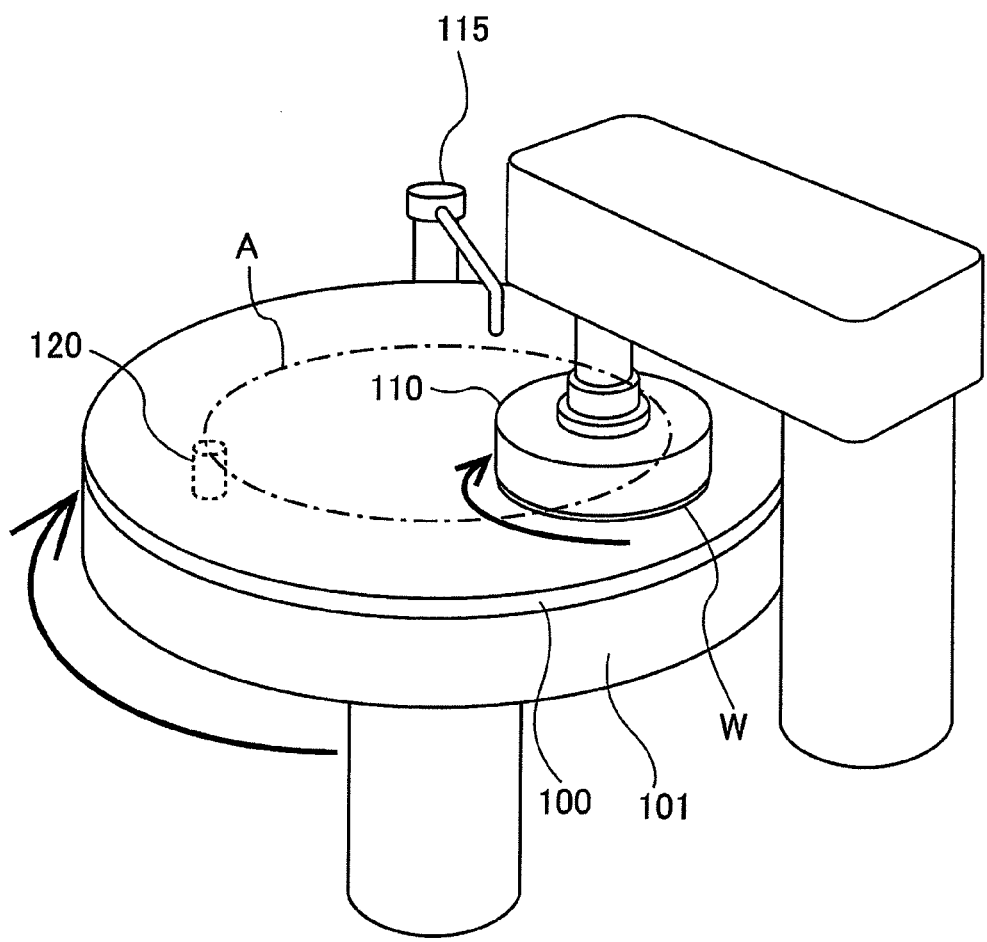
FIG. 1 is a schematic view of a CMP apparatus.
Figure 2:
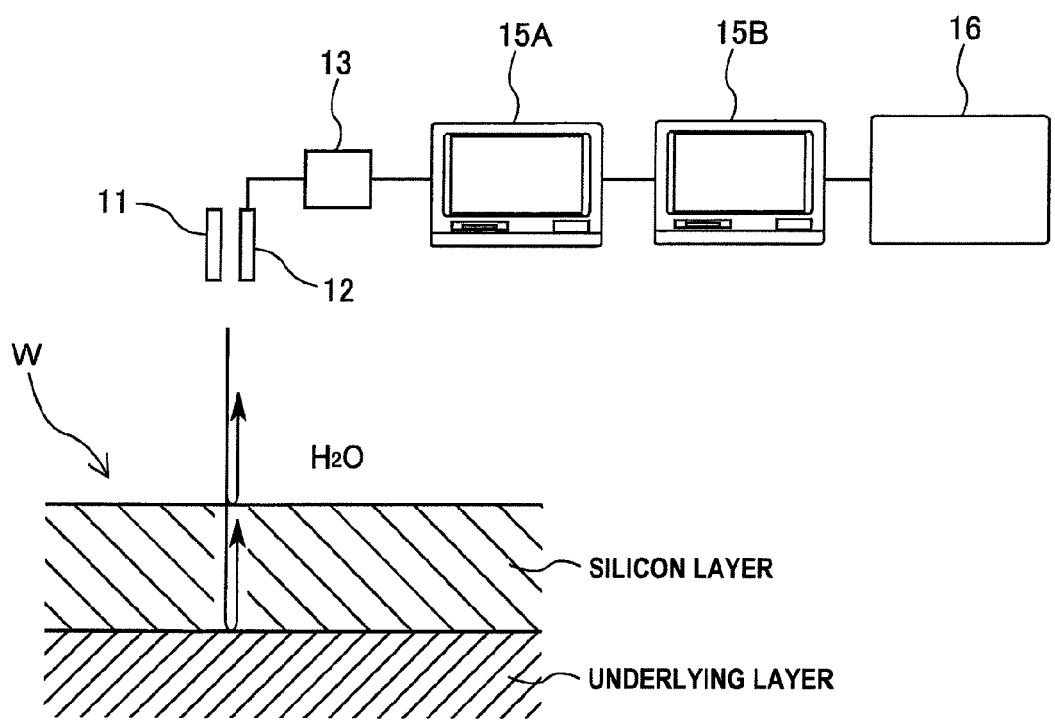
FIG. 2 is a schematic view for illustrating the principle of an optical polishing end point detection method.
Figure 3:
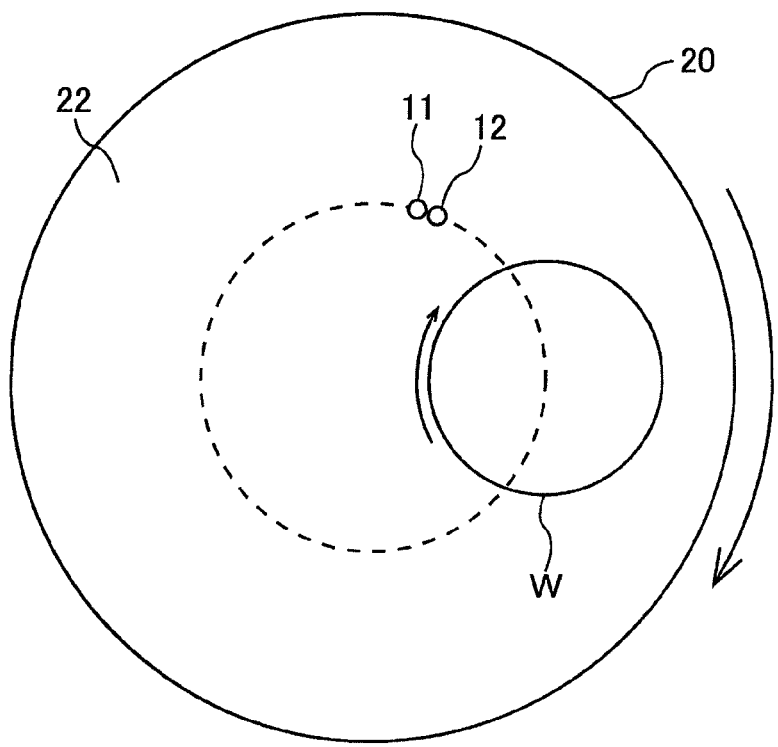
FIG. 3 is a plan view showing positional relationship between wafer and polishing table.

Embodiments of the present invention will be described below with reference to the drawings. FIG. 2 is a schematic view for illustrating the principle of an optical polishing end point detection method, and FIG. 3 is a plan view showing positional relationship between wafer and polishing table. A wafer (or substrate) W is a wafer used in fabricating backside illumination (BSI) image sensor or through-silicon via (TSV). As shown in FIG. 2, the wafer W has an underlying layer (e.g., integrated circuits) and a silicon layer formed on the underlying layer. The wafer W is held by a top ring (not shown in FIGS. 2 and 3) and rotated about its central axis as shown in FIG. 3. A surface of the wafer W is pressed by the top ring against a polishing pad 22 on a rotating polishing table 20, so that the silicon layer of the wafer W is polished by sliding contact with the polishing pad 22, which is a polishing tool having a polishing surface for polishing the wafer W.

An irradiator 11 and an optical receiver 12 are disposed in the polishing table 20 and are arranged so as to face the surface of the wafer W. The irradiator 11 has LED (not shown) for emitting infrared ray and is configured to direct the infrared ray to the surface of the wafer W. Each time the polishing table 20 makes one revolution, multiple regions, including the center of the wafer W, are irradiated with the infrared ray.

The optical receiver 12 is configured to receive the infrared ray reflected from the wafer W. A spectroscope 13 is coupled to the optical receiver 12. This spectroscope 13 resolves the reflected infrared ray according to wavelength and measures intensity of the reflected infrared ray at each of wavelengths. A first processor 15A is coupled to the spectroscope 13. This first processor 15A is configured to read intensity data of the infrared ray obtained by the spectroscope 13 and create intensity distribution of the reflected infrared ray. More specifically, the first processor 15A produces spectral waveform that represents intensities of the infrared ray at the respective wavelengths. This spectral waveform is expressed as line graph (i.e., waveform) showing relationship between wavelength and intensity of the infrared ray.

The infrared ray, directed to the wafer W, is reflected off an interface between a medium (e.g., water in the example of FIG. 2) and the silicon layer and an interface between the silicon layer and the underlying layer beneath the silicon layer. The infrared rays from these interfaces interfere with each other. The manner of interference between the infrared rays varies according to the thickness of the silicon layer (i.e., a length of an optical path). As a result, the spectral waveform produced from the reflected infrared ray from the wafer varies according to the thickness of the silicon layer. The first processor 15A performs FFT (fast Fourier transform) process on the spectral waveform to analyze the spectral waveform and determines a current thickness of the silicon layer from the analysis result. As shown in FIG. 2, when water is used as the medium, it is preferable to use near infrared ray having the wavelength in the range of 800 nm to 1000 nm in order to prevent the infrared ray from being absorbed into the water. The near infrared ray in the range of 800 nm to 1000 nm is suitable for a thin silicon layer (with the thickness of at most 2 μm).

The first processor 15A is coupled to a second processor 15B. A value of the thickness of the silicon layer determined by the first processor 15A is sent to the second processor 15B. This second processor 15B is configured to compare the thickness of the silicon layer with a predetermined target value and determine whether or not the thickness of the silicon layer has reached the target value. When the thickness of the silicon layer has reached the target value, the second processor 15B judges that polishing of the silicon layer has reached its end point and sends a polishing end point detection signal to an operation controller 16 of a polishing apparatus (CMP apparatus). Upon receiving the polishing end point detection signal, the operation controller 16 terminates the wafer polishing operation. In this embodiment, the first processor 15A and the second processor 15B constitute a polishing monitoring unit. The first processor 15A and the second processor 15B may be unified into one processor.

Figure 4:
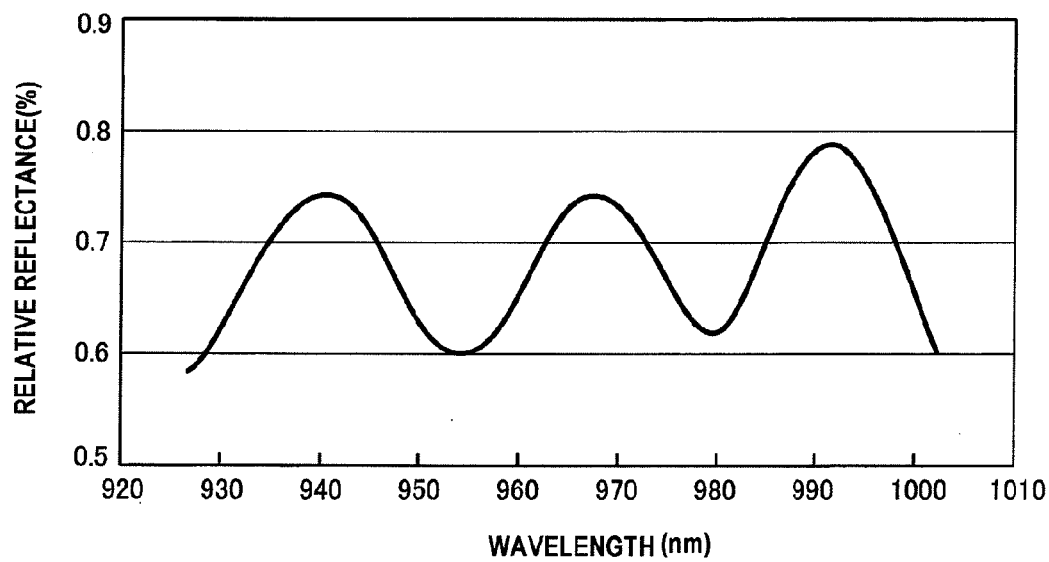
FIG. 4 is a diagram showing spectral waveform created by a first processor.

Hereinafter, the first processor 15A will be described in more detail. FIG. 4 is a diagram showing spectral waveform created by the first processor 15A. In FIG. 4, horizontal axis represents wavelength of the infrared ray reflected from the wafer, and vertical axis represents relative reflectance derived from the intensity of the infrared ray. The relative reflectance is an index that represents the reflection intensity of the infrared ray. More specifically, the relative reflectance is a ratio of the intensity of the infrared ray to a predetermined corresponding reference intensity. By dividing intensities of the infrared ray (i.e., the actually measured intensity) at the respective wavelengths by predetermined reference intensities, unwanted noise, such as a variation in the intensity inherent in an optical system or light source of the apparatus, are removed from the actually measured intensity. As a result, the spectral waveform reflecting only the thickness information of the silicon layer can be obtained.

The predetermined reference intensity may be an intensity of the reflected infrared ray obtained when a silicon wafer (bare wafer) with no film thereon is being polished in the presence of water. In the actual polishing process, a dark level (which is a background intensity obtained under the condition that the light is cut off) is subtracted from the actually measured intensity to determine a corrected actually measured intensity. Further, the dark level is subtracted from the reference intensity to determine a corrected reference intensity. Then the relative reflectance is calculated by dividing the corrected actually measured intensity by the corrected reference intensity. That is, the relative reflectance $R(\lambda)$ can be calculated by using $$R(\lambda) = \frac{E(\lambda) - D(\lambda)}{B(\lambda) - D(\lambda)}$$

where $\lambda$ is wavelength, $E(\lambda)$ is the intensity of the infrared ray reflected from the wafer, $B(\lambda)$ is the reference intensity, and $D(\lambda)$ is the background intensity (i.e., dark level) obtained under the condition that the wafer does not exist.

The first processor 15A performs the fast Fourier transform (or Fourier transform) process on the obtained spectral waveform to analyze the spectral waveform. More specifically, the first processor 15A extracts frequency components and strengths thereof from the spectral waveform, converts the frequency components obtained into thicknesses of the silicon layer using a predetermined relational expression, and produces a frequency spectrum that represents relationship between the thickness of the silicon layer and the strength of the frequency component. The above-mentioned predetermined relational expression is a linear function representing the thickness of the silicon layer and having the frequency component as variable. This linear function can be obtained from actual measurement results or the like.

Figure 5:
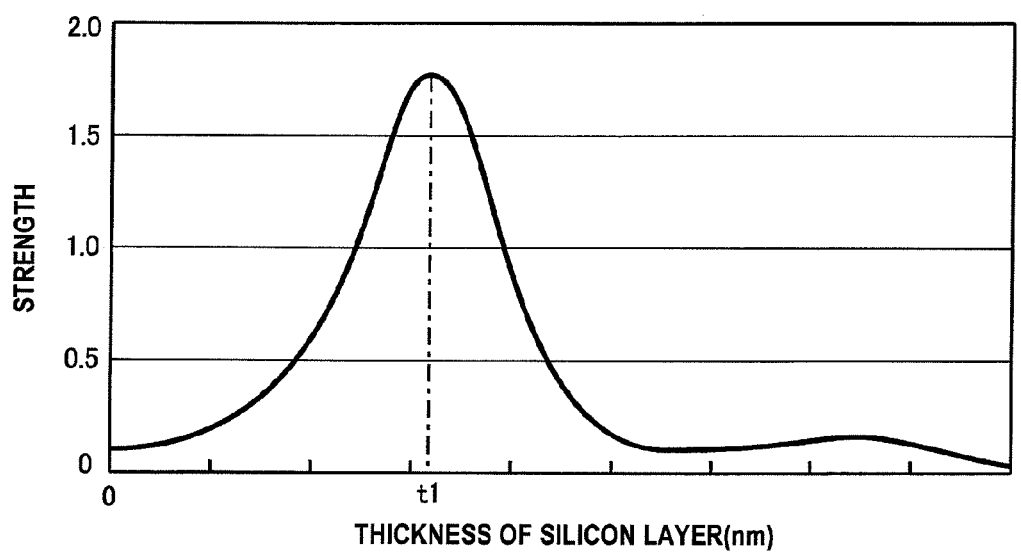
FIG. 5 is a diagram showing frequency spectrum created by the first processor.

FIG. 5 is a diagram showing the frequency spectrum produced by the first processor 15A. In FIG. 5, vertical axis represents strength of the frequency component contained in the spectral waveform, and horizontal axis represents thickness of the silicon layer. As can be seen from FIG. 5, the strength reaches its maximum at the thickness of t1. That is, this frequency spectrum indicates that the thickness of the silicon layer is t1. In this manner, the thickness of the silicon layer is determined from a peak of the frequency spectrum.

Figure 6:
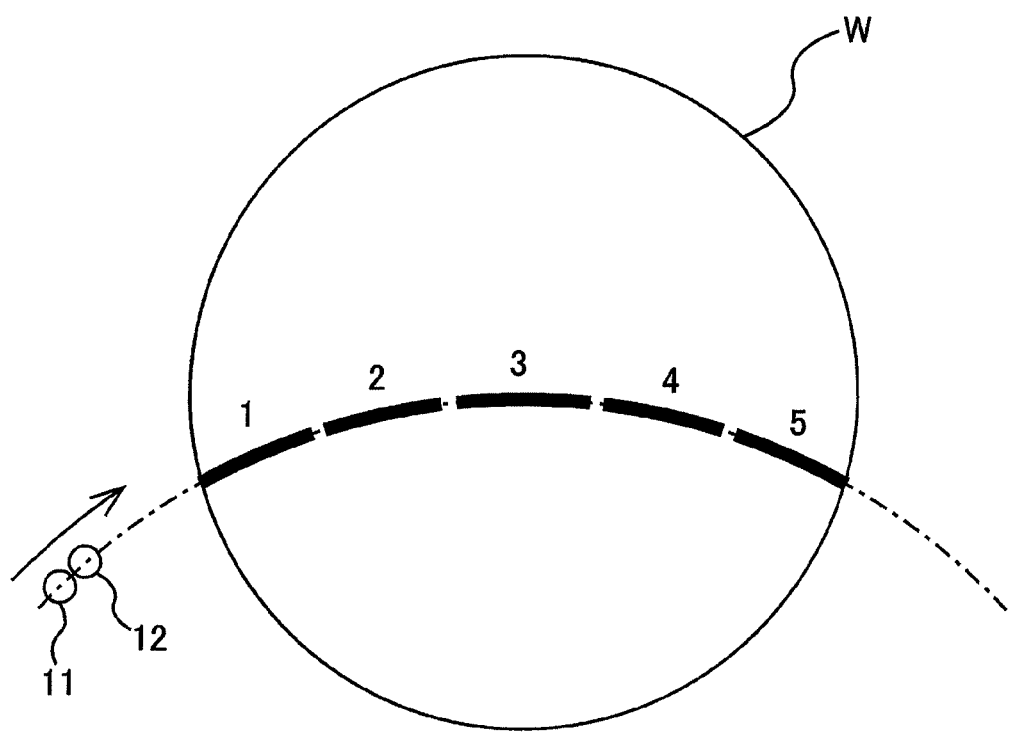
FIG. 6 is a diagram showing an example in which measuring operation is performed five times while the polishing table is making one revolution.

It is preferable to measure the thickness of the silicon layer several times while the polishing table 20 is making one revolution. One measuring time depends on an exposure time of the wafer W, i.e., a time during which the wafer W is exposed to the infrared ray. Therefore, the number of measuring operations conducted while the polishing table 20 is making one revolution is determined from the exposure time, the rotational speed of the polishing table 20, and the rotational speed of the top ring. FIG. 6 is a diagram showing an example in which the measuring operation is performed five times while the polishing table 20 is making one revolution under the condition that the rotational speed of the polishing table 20 and the rotational speed of the top ring are approximately the same. As shown in FIG. 6, tips of the irradiator 11 and the optical receiver 12 pass through the center of the wafer W when sweeping the wafer W. During the sweep across the wafer W, five measuring operations are performed. Therefore, each time the polishing table 20 makes one revolution, five measured values, each representing the thickness of the silicon layer, are obtained. These measured values are sent from the first processor 15A to the second processor 15B, which determines the polishing end point based on the measured values of the thickness of the silicon layer.

As discussed above, several measured values are obtained during one revolution of the polishing table 20. However, some of the measured values may not represent the thickness of the silicon layer accurately. Possible causes of such unreliable measured values include relatively large steps existing on the surface of the silicon layer which are measured together with other regions through one measuring operation and lack of a quantity of infrared ray reflected from the wafer due to some reasons.

FIG. 7 is a table showing measurement data obtained when polishing a wafer having backside illumination (BSI) image sensor formed thereon. Typically, in the fabrication process of the backside illumination image sensor, a silicon layer having a thickness of less than about 10 µm is polished. As can be seen from FIG. 7, each time the polishing table 20 makes one revolution, five measured values each indicating the silicon layer thickness and five values each indicating the strength of the frequency component corresponding respectively to these measured values are obtained.

However, the measured value with a low strength tends to differ greatly from other measured values. In other words, the measured value with a low strength of the frequency component does not represent the actual thickness of the silicon layer accurately. Thus, the measured value with a lower strength of the frequency component than a predetermined threshold value is removed from measurement data, so that the second processor 15B obtains monitoring data that contains only reliable measured values. Symbol ○ shown in FIG. 7 represents measured value with the strength equal to or more than the predetermined threshold value, and symbol X represents measured value with the strength lower than the predetermined threshold value. In FIG. 7, the monitoring data consists of the measured values with the symbol ○.

Every time the measured value is obtained, the strength of the frequency component corresponding to that measured value obtained is compared with the threshold value. If the strength is equal to or higher than the threshold value, the measured value (i.e., the measured value with the symbol of ○) is identified as reliable measured value by the second processor 15B. This reliable measured value is added to the monitoring data and is used in monitoring of the thickness of the silicon layer. If the strength is lower than the threshold value, the measured value (i.e., the measured value with the symbol X) is not added to the monitoring data. As a result, the monitoring data contains only the reliable measured values.

Figure 8:
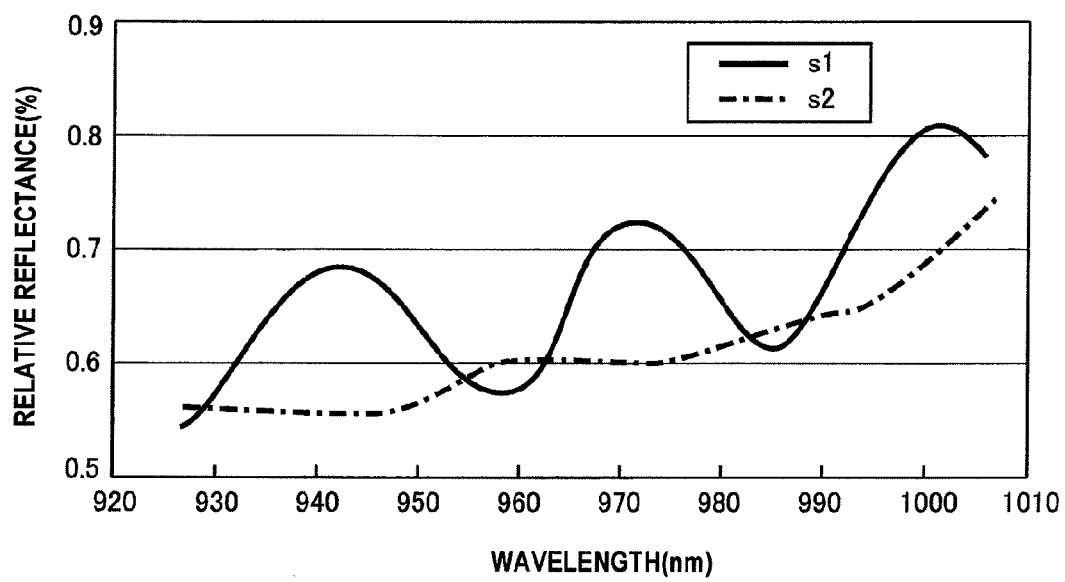
FIG. 8 is a diagram showing spectral waveforms obtained when polishing the wafer having the backside illumination (BSI) image sensor.

FIG. 8 is a diagram showing spectral waveforms obtained when polishing the wafer having the above-described backside illumination (BSI) image sensor formed thereon. FIG. 8 shows two spectral waveforms s1, s2 that are obtained in different regions on the wafer while the polishing table 20 is making one revolution. As can be seen from FIG. 8, the spectral waveform s1 contains relatively clear sine wave, while the other spectral waveform s2 does not contain clear sine wave. This is probably due to the steps formed on the surface of the silicon layer or lack of the quantity of the reflected infrared ray, as described above.

Figure 9:
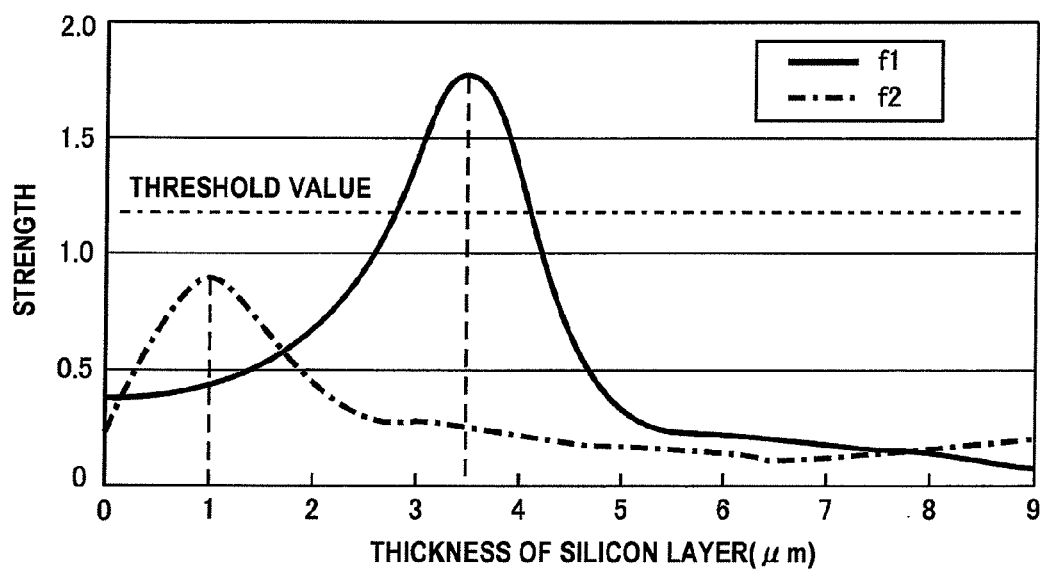
FIG. 9 is a diagram showing frequency spectra created from the spectral waveforms shown in FIG. 8.

FIG. 9 is a diagram showing frequency spectra created from the spectral waveforms shown in FIG. 8. In FIG. 9, vertical axis represents the strength of the frequency component contained in the spectral waveform, and horizontal axis represents thickness of the silicon layer converted from the frequency component. The strength of the frequency component represents a size of the sine wave forming the spectral waveform, and is approximately proportional to an amplitude of the sine wave. A frequency spectrum f1 shown in FIG. 9 corresponds to the spectral waveform s1 shown in FIG. 8, and a frequency spectrum f1 shown in FIG. 9 corresponds to the spectral waveform s2 shown in FIG. 8.

As can be seen from FIG. 9, the frequency spectrum f1 has a peak indicating that the silicon layer has a thickness of 3.5 µm. That is, the frequency spectrum f1 indicates that the silicon layer has a thickness of 3.5 µm. The frequency spectrum f2 has a peak indicating that the silicon layer has a thickness of 1 µm. Therefore, the measured value of the thickness of the silicon layer obtained from the frequency spectrum f2 is 1 µm. However, this measured value of 1 µm is greatly different from the measured value of 3.5 µm obtained from the frequency spectrum f1.

As can be seen from FIG. 8 and FIG. 9, when the spectral waveform shows clear sine wave, the frequency spectrum has a peak indicating a high strength. The spectral waveform showing the clear sine wave is considered to mean the fact that the infrared rays shown in FIG. 2 interfere with each other without being affected by a variation in the thickness of the silicon layer. Therefore, it can be said that such spectral waveform contains accurate information of the thickness of the silicon layer. Thus, the second processor 15B removes inaccurate measured values from the measurement data based on the strength indicated by the peak of the frequency spectrum to produce the monitoring data containing only accurate measured values. More specifically, the second processor 15B selects the measured values with the strength equal to or higher than the predetermined threshold value and adds only the selected measured values to the monitoring data.

The threshold value can be determined as follows. One wafer is polished, so that the measurement data is obtained. A provisional threshold value is set for the measurement data obtained. For example, if a total number of measured values whose strength is not more than the provisional threshold value is equal to or less than 20% of the measurement data, the provisional threshold value is used as the above-mentioned threshold value.

In the example shown in FIG. 9, the threshold value is set to 1.2, while the strength indicated by the peak of the frequency spectrum f1 is about 1.8. Therefore, the measured value of 3.5 µm, which is obtained from the peak of the frequency spectrum f1, is determined to be a reliable measured value and is used as the monitoring data. On the contrary, the frequency spectrum f2 has its peak indicating the strength of about 0.9. Therefore, the measured value of 1 µm, which is obtained from the frequency spectrum f1, is not used as the monitoring data. In this manner, the measured values are sorted into reliable ones and unreliable ones based on the corresponding strength of the frequency component.

In the above example, the threshold value is a preset fixed value. Instead, the threshold value may be changed based on a plurality of measured values contained in the monitoring data that have been obtained previously. For example, an average of the strengths of the multiple frequency components corresponding to the latest multiple measured values may be calculated, and a predetermined percentage of the average obtained may be used as the threshold value. For example, 80% of the average obtained may be determined to be the threshold value. The previously obtained measured values include measured values that have been obtained previously in the current polishing process of the wafer, measured values that have been obtained when a foregoing wafer was being polished, and measured values that have been obtained previously in another polishing apparatus.

The second processor 15B receives the measurement data from the first processor 15A and produces the above-described monitoring data from the measurement data. As discussed above, the monitoring data contains only the reliable measured values. The second processor 15B monitors the measured values contained in the monitoring data and determines the polishing end point from a point of time when the measured value has reached a predetermined target value. In order to determine the polishing end point more accurately, it is preferable to calculate moving average of the reliable measured values obtained. In this case, a point of time when the moving average has reached the predetermined target value is determined to be the polishing end point. Further, in order to determine the polishing end point more accurately, it is preferable to obtain average of the reliable measured values that are obtained while the polishing table 20 makes one revolution. Further, it is preferable to obtain moving average of the average obtained.

Figure 10:
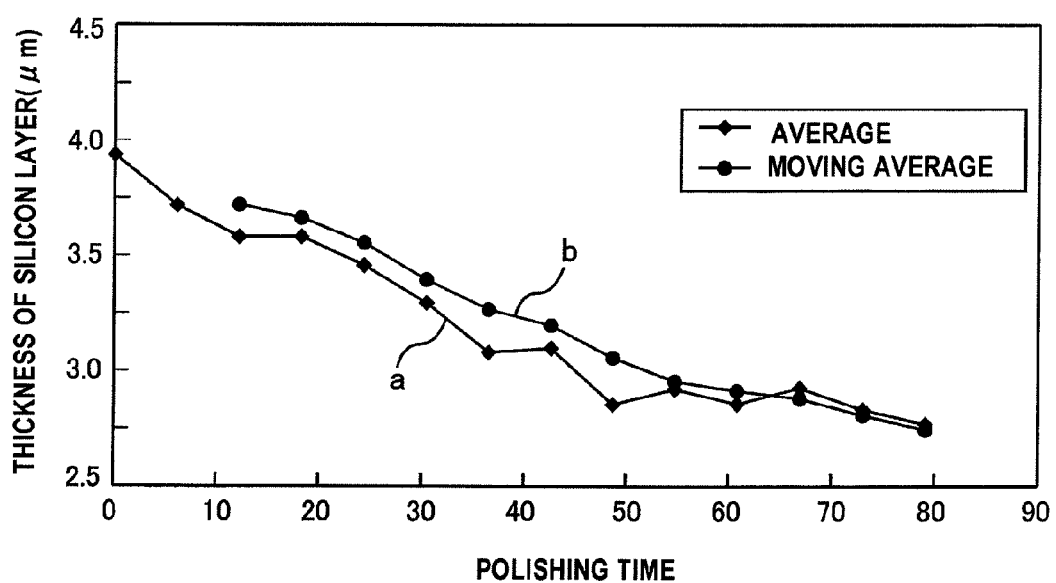
FIG. 10 is a diagram showing relationship between thickness of a silicon layer and polishing time.

FIG. 10 is a diagram showing relationship between thickness of the silicon layer and polishing time. In FIG. 10, graph a shows a temporal change in the average of the multiple measured values obtained while the polishing table 20 is making one revolution, and graph b shows a temporal change in the moving average of the above-mentioned average. The moving average is an average of the latest averages (e.g., the latest three averages). The polishing end point is a point of time when the average (the graph a) or the moving average (the graph b) of the measured values has reached the preset target value. The second processor 15B determines the polishing end point of the wafer (i.e., the polishing end point of the silicon layer) from the point of time when the average (the graph a) or the moving average (the graph b) of the measured values has reached the preset target value. As can be seen from FIG. 10, the graph b is smoother than the graph a. Therefore, in order to detect a more accurate polishing end point, it is preferable to calculate the moving average as shown by the graph b and monitor the moving average obtained.

Figure 11:
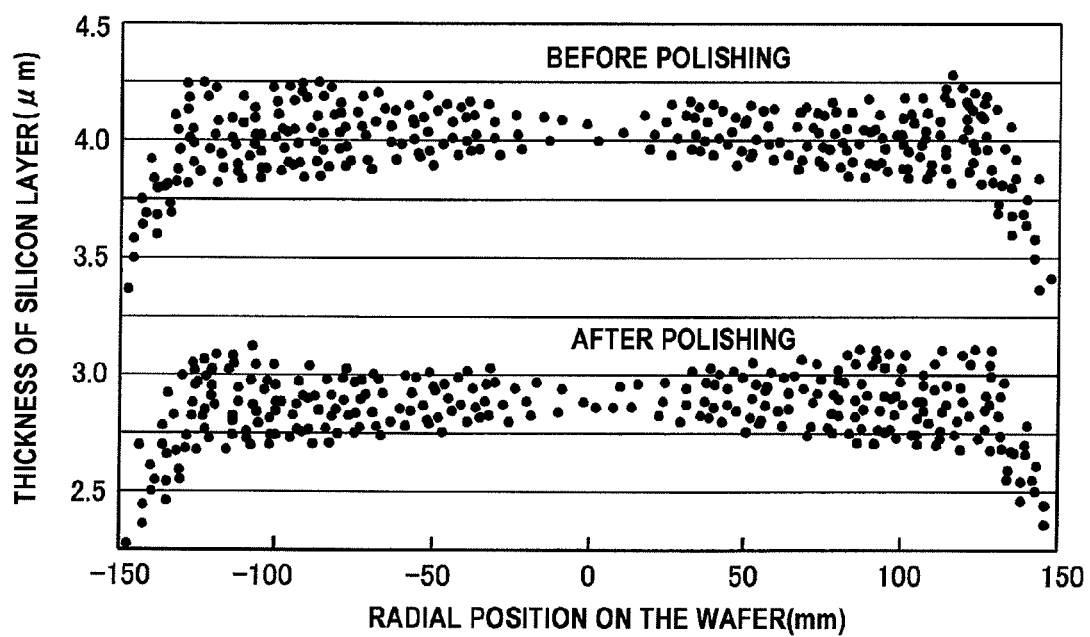
FIG. 11 is a diagram showing polishing profiles before and after polishing.

FIG. 11 is a diagram showing polishing profiles before and after polishing of the wafer. Vertical axis represents the thickness of the silicon layer, and horizontal axis represents radial position on the wafer. As shown in FIG. 11, the variation in the measured value at the central region of the wafer is relatively small. In other words, the measured values obtained in the central region of the wafer are reliable ones. Therefore, it is preferable to determine the polishing end point by using only the measured values obtained in the central region of the wafer. However, the present invention is not limited to this example. The measured values obtained in regions other than the central region of the wafer can also be used. For example, it is possible to determine the polishing end point using only the measured values obtained in a peripheral region of the wafer. Further, it is also possible to use the measured values obtained in preselected regions (e.g., the central region and the peripheral region of the wafer shown in FIG. 6).

Figure 12:
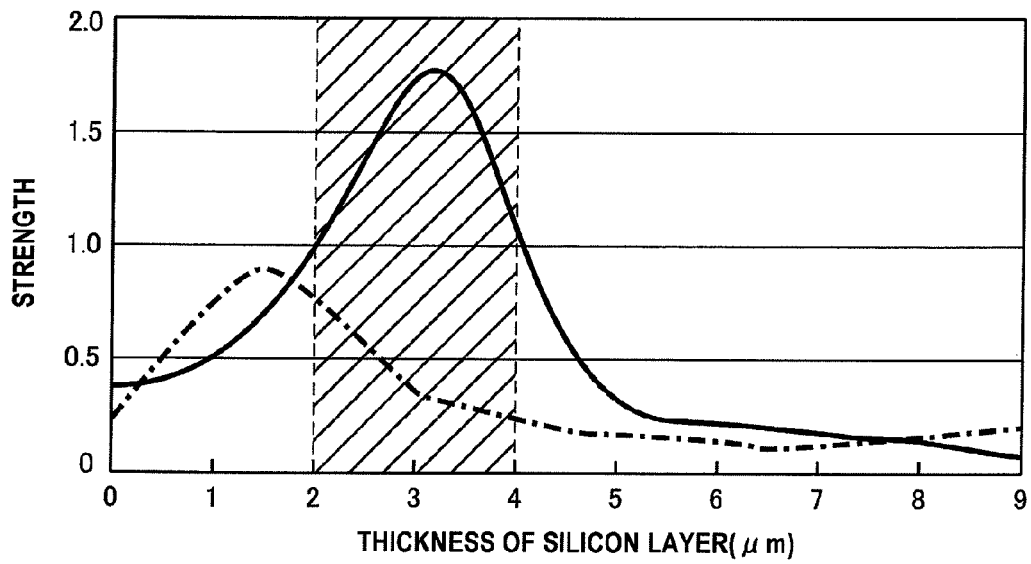
FIG. 12 is a diagram showing an example of using a predetermined threshold value with respect to strength of frequency component as a criterion for sorting measured values.

While the measured values are sorted into reliable ones and unreliable ones based on the strength of the frequency component in the example shown in FIG. 7 and FIG. 9, the measured values may be sorted based on the measured values themselves. Specifically, if the measured value obtained is within a predetermined range, that measured value is identified as the reliable measured value. For example, in a case where the thickness of the silicon layer is known (e.g., in the range of about 3 µm to 4 µm), if the measured value obtained is in the range of 2.0 µm to 4.0 µm (shown by hatching in FIG. 12), that measured value can be determined to be a reliable one. On the contrary, if the measured value obtained is outside the range of 2.0 µm to 4.0 µm, that measured value can be determined to be an unreliable one. In this manner, when the thickness of the silicon layer to be polished is known, the range of the known thickness can be used as a criterion for judging the reliability of the measured value.

Figure 13:
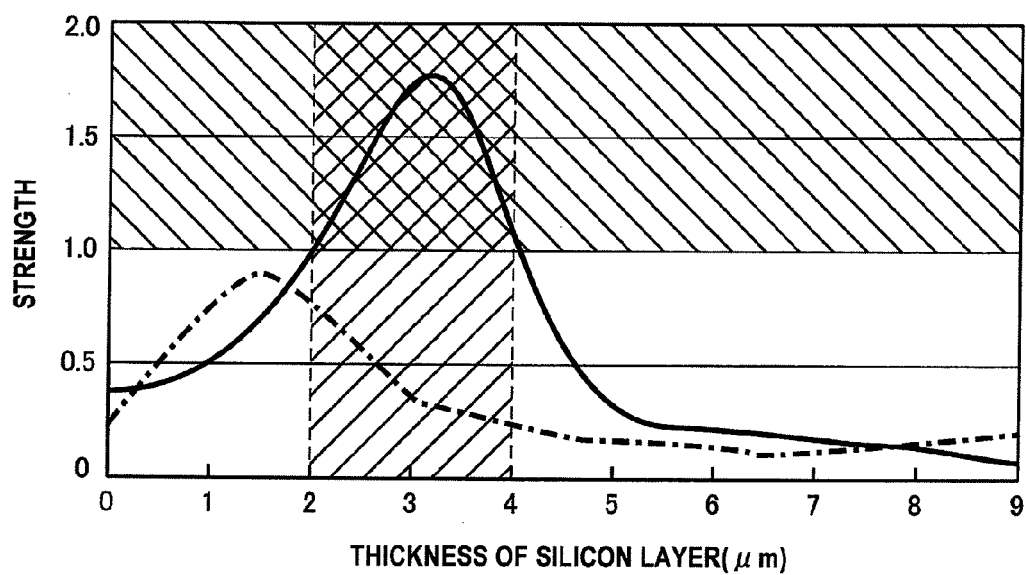
FIG. 13 is a diagram showing an example of using the predetermined threshold value with respect to the strength of the frequency component and a predetermined range with respect to thickness of the silicon layer as criteria for sorting measured values.

Further, it is also possible to use both of the predetermined threshold value with respect to the strength of the frequency component and the predetermined range with respect to the thickness of the silicon layer so as to sort the measured values obtained. FIG. 13 is a diagram showing an example of using the predetermined threshold value with respect to the strength of the frequency component and the predetermined range with respect to the thickness of the silicon layer as criteria for sorting the measured values. In this example, the threshold value with respect to the strength of the frequency component is 1 and the predetermined range with respect to the thickness of the silicon layer is from 2.0 µm to 4.0 µm. If the strength of the frequency component is equal to or higher than 1 and the thickness of the silicon layer is within the range of 2.0 µm to 4.0 µm (i.e., if the peak of the frequency spectrum lies in a mesh region shown in FIG. 13), then the measured value is determined to be reliable by the second processor 15B and is added to the monitoring data. On the contrary, if the peak of the frequency spectrum is out of the mesh region shown in FIG. 13, then the measured value is determined to be unreliable and is not added to the monitoring data.

The two spectral waveforms shown in FIG. 8 are inclined with right upward gradient in their entirety. Such inclination of the spectral waveform in its entirety appears as noise on the frequency spectrum, which prevents accurate measurement of the thickness of the silicon layer. Thus, in order to obtain the frequency spectrum with no noise, it is preferable to perform a noise removing process which includes the steps of: preparing a reference silicon wafer (bare silicon wafer); irradiating the reference silicon wafer with the infrared ray; calculating the relative reflectance at respective wavelengths of the infrared ray reflected from the reference silicon wafer to obtain a reference spectral waveform; performing the fast Fourier transform process on the reference spectral waveform to obtain a reference frequency spectrum in advance; and dividing the frequency spectrum obtained when polishing the wafer W as shown in FIG. 9 by the reference frequency spectrum to thereby obtain a frequency spectrum with no noise. More specifically, the frequency spectrum obtained during polishing is corrected by dividing the strengths of the frequency component at the respective thicknesses of the silicon layer on the currently-obtained frequency spectrum by the corresponding strengths of the frequency component on the reference frequency spectrum. It is preferable to determine the thickness of the silicon layer and the corresponding strength of the frequency component based on the corrected frequency spectrum.

Figure 14:
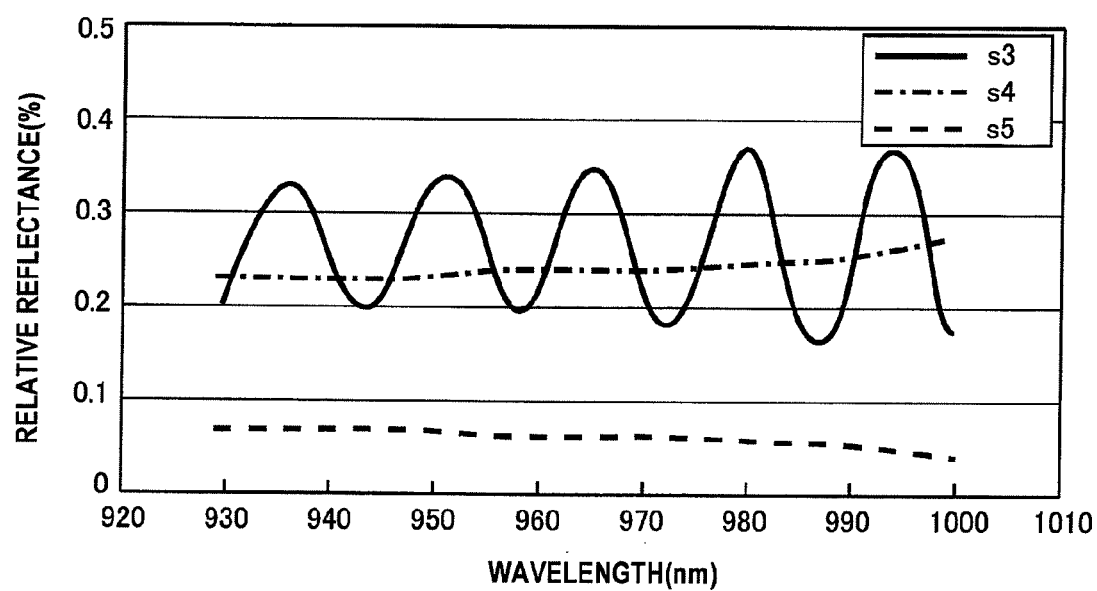
FIG. 14 is a diagram showing spectral waveforms obtained when polishing the silicon layer in fabrication process of through-silicon via (TSV)
Figure 15:
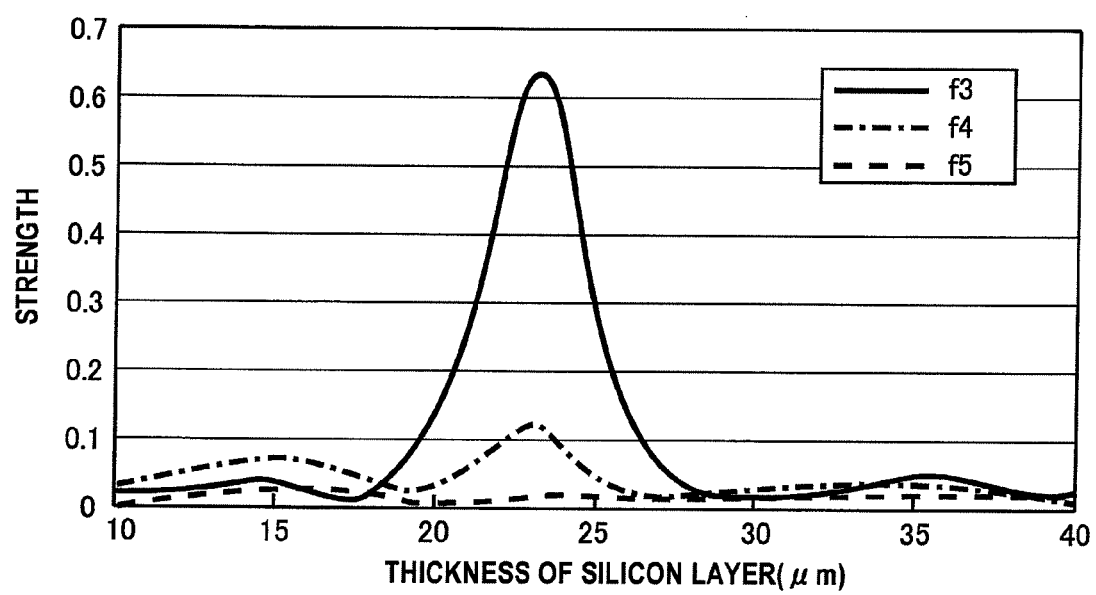
FIG. 15 is a diagram showing frequency spectra created from the spectral waveforms shown in FIG. 14.

FIG. 14 is a diagram showing the spectral waveforms obtained when polishing the silicon layer in the fabrication process of through-silicon via (TSV), and FIG. 15 is a diagram showing the frequency spectra created from the spectral waveforms shown in FIG. 14. The spectral waveforms s3, s4, and s5 in FIG. 14 correspond to the frequency spectra f3, f4, and f5 in FIG. 15, respectively. The spectral waveforms shown in FIG. 14 and the frequency spectra shown in FIG. 15 are produced in the same ways as the spectral waveform shown in FIG. 4 and the frequency spectrum shown in FIG. 5. Therefore, repetitive explanations are omitted.

In the fabrication process of through-silicon via (TSV), the thickness of the silicon layer to be polished is in the range of about 20 µm to 50 µm. In this case also, the predetermined threshold value of the strength of the frequency component and/or the predetermined range of the thickness of the silicon layer may be used as the criterion of sorting the measured values. The polishing end point detection technique according to the present invention can be applied to both the BSI process including the polishing process of the silicon layer having a thickness of less than 10 μm and the TSV process including the polishing process of the silicon layer having a thickness in the range of about 20 μm to 50 μm.

The irradiator 11 is configured to switch the quantity of the infrared ray emitted from the irradiator 11. It is preferable to change the quantity of the infrared ray in accordance with conditions of the silicon layer to be polished. The conditions of the silicon layer include the thickness of the silicon layer, a flatness of the surface of the silicon layer (i.e., uniformity of surface flatness), a thickness and a material of a film lying under the silicon layer, and a density of interconnect patterns lying under the silicon layer. For example, when polishing a thin silicon layer as in the BSI process, it is preferable to reduce the quantity of the infrared ray emitted from the irradiator 11, and when polishing a thick silicon layer as in the TSV process, it is preferable to increase the quantity of the infrared ray.

Figure 16:
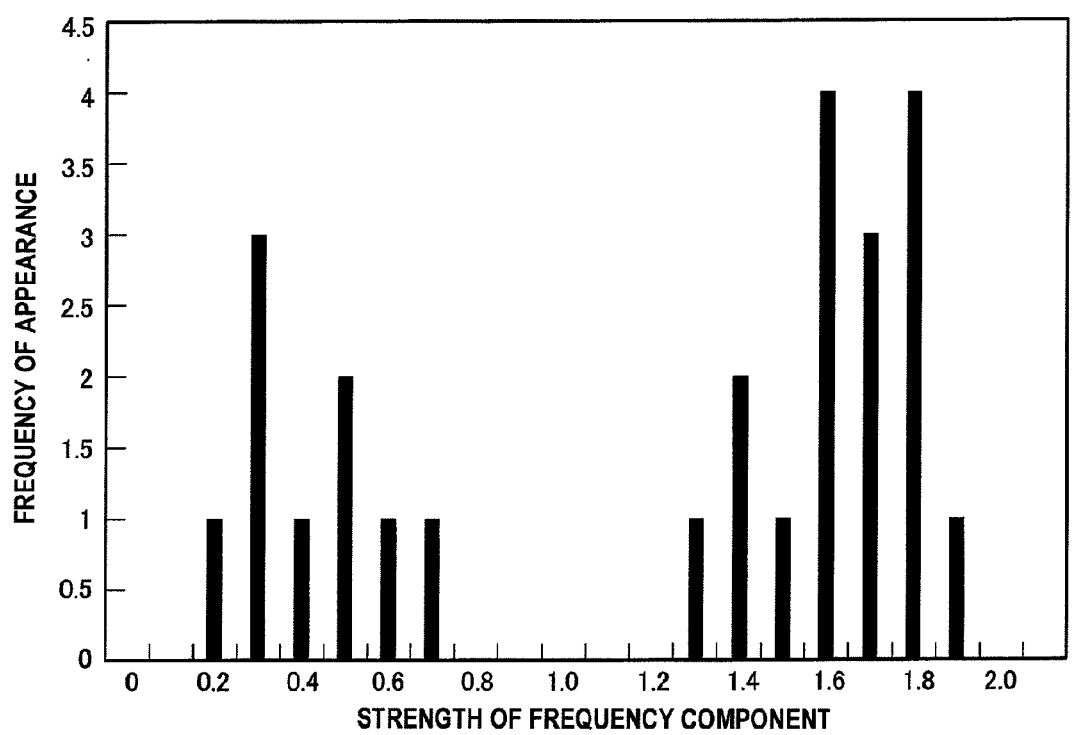
FIG. 16 is a histogram showing frequency distribution of the strength of the frequency component.

Next, an example of a method of determining the threshold value will be described. FIG. 16 is a histogram showing frequency distribution of the strength of the frequency component. In FIG. 16, vertical axis represents frequency of appearance of the strength of the frequency component, and horizontal axis represents the strength of the frequency component. The histogram in FIG. 16 shows the strengths of the frequency component corresponding to 25 measured values. These 25 measured values are those obtained in five regions on the wafer (see FIG. 6) during five revolutions of the polishing table. Therefore, a sum total of the frequency of appearance is 25.

The frequency distribution of the strength of the frequency component varies depending on characteristics of the wafer to be polished. The example in FIG. 16 shows a tendency that the strengths of the frequency component are polarized into two groups: a reliable group and an unreliable group. In this case, an intermediate value (i.e., an average) between weighted averages of the respective two groups is used as the above-described threshold value. In the example shown in FIG. 16, the weighted average of the strengths of the frequency component belonging to the unreliable group is about 0.4, while the weighted average of the strengths of the frequency component belonging to the reliable group is about 1.6. The intermediate value of these two weighted averages is 1.0 (=(0.4+1.6)/2). Therefore, in this example, the threshold value of the strength of the frequency component is 1.0. If the strengths of the frequency component are not polarized, a weighted average of the whole strengths of the frequency component shown in the frequency distribution (histogram) is used as the threshold value. In this manner, stable sorting of the measured values based on the reliability can be achieved by determining the threshold value based on the weighted average calculated from the frequency distribution showing the strengths of the frequency component that have been obtained previously.

Figure 17:
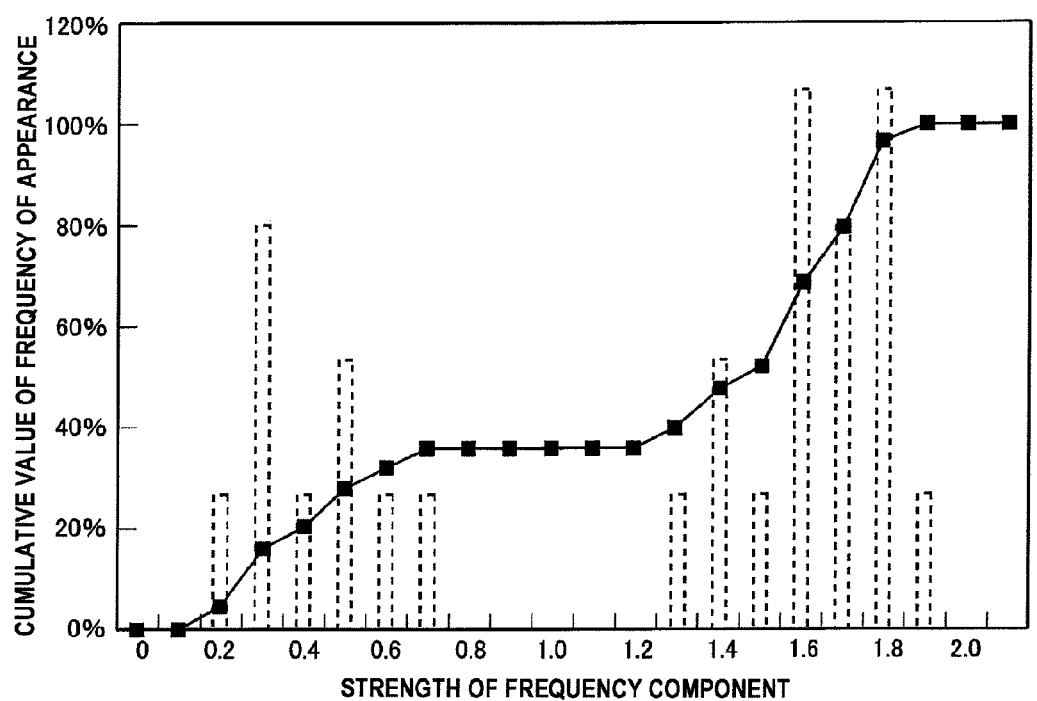
FIG. 17 is a diagram showing cumulative frequency polygon graph created from the histogram shown in FIG. 16.

Next, another example of the method of determining the threshold value will be described. FIG. 17 is a diagram showing cumulative frequency polygon graph created from the histogram shown in FIG. 16. Vertical axis represents cumulative value (expressed as percentage) of frequency of appearance of the strength of the frequency component. A value of 100% corresponds to 25 which is a total number of measured values. Accordingly, percentage per one measured value is 4% (=100%/25). Since there is one measured value with the strength of 0.2, the frequency of appearance of that measured value is 4%. Since there are three measured values with the strength of 0.3, the frequency of appearance of that measured value is 12% (=4%×3). Since the vertical axis in FIG. 17 represents the cumulative value of the frequency of appearance, the cumulative value at the strength of 0.3 is 4+12=16%. That is, the cumulative frequency polygon graph is a graph representing a ratio of the cumulative value of the frequency of appearance to the total number of the measured values.

The threshold value is determined from the ratio of the reliable measured values to the measured values obtained previously. For example, in a case where the ratio of the unreliable measured values to all of the measured values is known to be about 20% and where 20% of the total number of measured values is permitted to be discarded, the threshold value is determined to be 0.4 because the value of 20% on the vertical axis corresponds to the strength of 0.4 on the horizontal axis. In this case, the polishing end point is detected using 80% of all of the measured values.

Both of the above-described frequency distribution and the cumulative frequency polygon graph may be used to determine the threshold value. For example, an average of the threshold value determined from the frequency distribution and the threshold value determined from the cumulative frequency polygon graph may be used as the threshold value for sorting the measured values. In the above-described methods of determining the threshold value, the measurement data that has been obtained previously is used. Examples of the previously-obtained measurement data include measured values that have been obtained previously in the current polishing process of the wafer, measured values that have been obtained when a foregoing wafer was being polished, and measured values that have been obtained previously in another polishing apparatus.

The method of determining the threshold value discussed with reference to FIG. 16 and FIG. 17 is based on a threshold-value determining method used in a binarization process in an image-processing field. For example, the method shown in FIG. 17 is Percentile method. It is also possible to use other threshold-value determining method in the image-processing field, such as a discriminate analysis method using separation metrics (this method is also referred to as Otsu's method).

Figure 18:
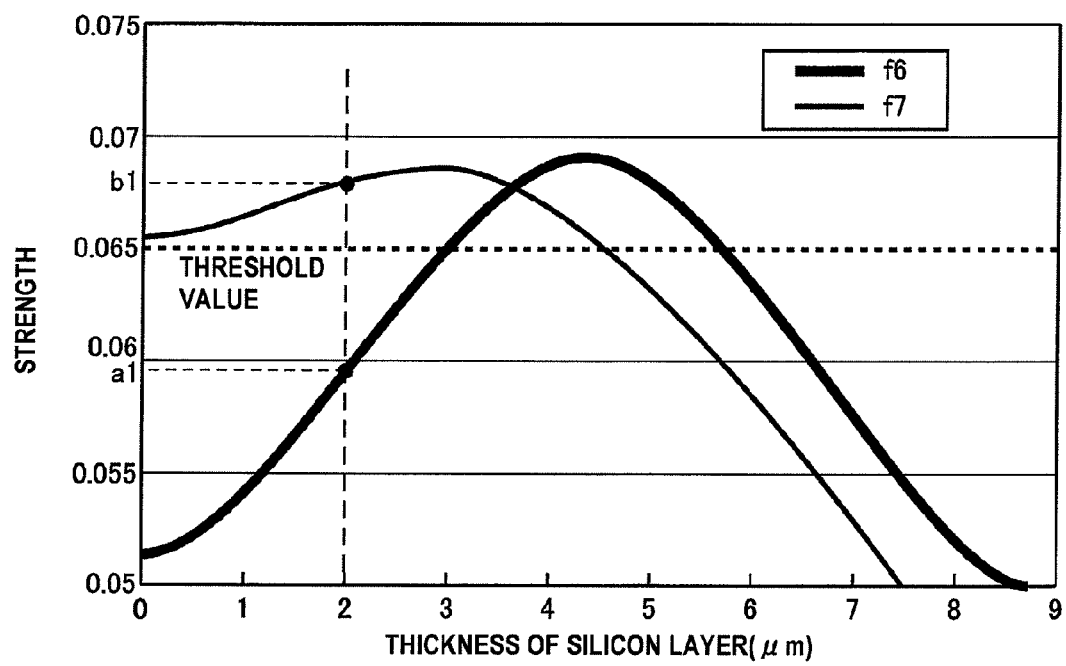
FIG. 18 is a diagram for illustrating another method of discriminating between reliable measured values and unreliable measured values.

FIG. 18 is a diagram for illustrating another method of discriminating between the reliable measured values and the unreliable measured values. FIG. 18 shows two frequency spectra f6 and f7 whose peaks indicate relatively high strengths. In this example, if the threshold value is set to 0.065, the measured values of the silicon layer thickness obtained from the frequency spectra f6 and f7 are both determined to be reliable. However, the frequency spectrum f7 has an obscure peak shape, compared with that of the frequency spectrum f6. Generally, the frequency spectrum having a clear peak shape tends to indicate a reliable measured value, while the frequency spectrum having an obscure peak shape tends to indicate an unreliable measured value.

Thus, in this method, instead of the strength at the peak of the frequency spectrum, a strength of the frequency component at a predetermined observation thickness is used to determine the reliability of the measured value. Specifically, if the strength of the frequency component at the predetermined observation thickness is lower than the threshold value, the measured value of the silicon layer thickness indicated by the peak of the frequency spectrum is determined to be reliable. On the contrary, if the strength of the frequency component at the predetermined observation thickness is equal to or higher than the threshold value, the measured value of the silicon layer thickness indicated by the peak of the frequency spectrum is determined to be unreliable.

In the example shown in FIG. 18, the predetermined observation thickness is set to 2 μm, and the threshold value is set to 0.065. In the frequency spectrum f6, a strength a1 of the frequency component at the observation thickness of 2 μm is lower than the threshold value 0.065. Therefore, the measured value obtained from the frequency spectrum f6 is determined to be reliable. On the contrary, in the frequency spectrum f7, a strength b1 of the frequency component at the observation thickness of 2 μm is higher than the threshold value 0.065. Therefore, the measured value obtained from the frequency spectrum 17 is determined to be unreliable. Plural observation thicknesses may be set. In this case, the strength at each observation thickness is compared with the above threshold value, and the reliability of the measured value is determined in the same manner as described above.

In this method, the reliability of the measured value may be determined based on the strength of the frequency component at the predetermined observation thickness, in addition to the strength at the peak of the frequency spectrum. Specifically, if the strength indicated by the peak of the frequency spectrum is higher than the predetermined threshold value and if the strength of the frequency component at the predetermined observation thickness is lower than the predetermined threshold value, the measured value of the silicon layer thickness indicated by the peak of the frequency spectrum is determined to be reliable. On the contrary, if the strength indicated by the peak of the frequency spectrum is equal to or lower than the predetermined threshold value and/or if the strength of the frequency component at the predetermined observation thickness is equal to or higher than the predetermined threshold value, the measured value of the silicon layer thickness indicated by the peak of the frequency spectrum is determined to be unreliable. In this manner, the reliability determination using the strength at the peak and the reliability determination using the strength at the predetermined observation thickness may be combined so as to realize more accurate sorting of the measured values.

Figure 19:
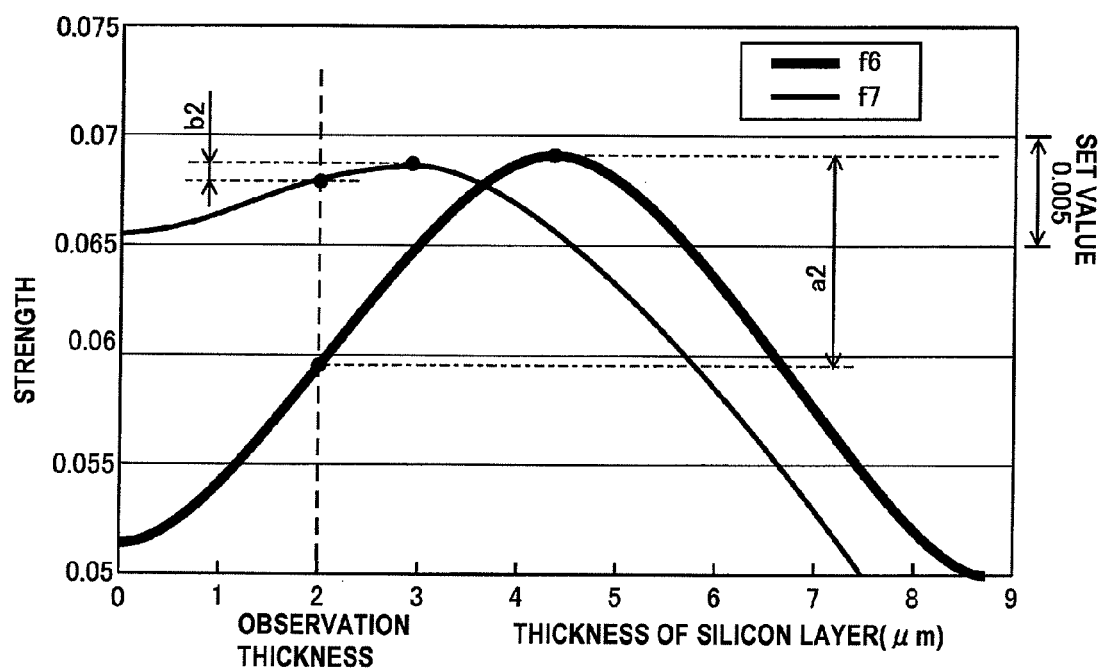
FIG. 19 is a diagram for illustrating modified example of the discrimination method shown in FIG. 18.

FIG. 19 is a diagram for illustrating modified example of the discrimination method shown in FIG. 18. In this method, a difference (absolute value) between the strength at the peak of the frequency spectrum and the strength at the predetermined observation thickness is compared with a predetermined set value. If the difference is larger than the set value, the measured value of the silicon layer thickness determined from the peak of the frequency spectrum is determined to be reliable. On the contrary, if the difference is equal to or smaller than the set value, the measured value of the silicon layer thickness determined from the peak of the frequency spectrum is determined to be unreliable.

In the example shown in FIG. 19, the set value of the above-described difference is 0.005. The difference a2 between the strength at the peak of the frequency spectrum f6 and the strength at the observation thickness of 2 μm is larger than the predetermined set value of 0.005. Therefore, the measured value of the silicon layer thickness determined from the peak of the frequency spectrum f6 is determined to be reliable. On the contrary, the difference b2 between the strength at the peak of the frequency spectrum f7 and the strength at the observation thickness of 2 μm is smaller than the predetermined set value of 0.005. Therefore, the measured value of the silicon layer thickness determined from the peak of the frequency spectrum f7 is determined to be unreliable. In this example also, plural observation thicknesses may be set.

In this method also, it is possible to combine the determination of the reliability based on the strength at the peak of the frequency spectrum and the determination of the reliability based on the above-described difference. Specifically, if the strength indicated by the peak of the frequency spectrum is higher than the predetermined threshold value and if the above-described difference is larger than the predetermined set value, the measured value of the silicon layer thickness indicated by the peak of the frequency spectrum is determined to be reliable. On the contrary, if the strength indicated by the peak of the frequency spectrum is equal to or lower than the predetermined threshold value and/or if the above-described difference is equal to or smaller than the predetermined set value, the measured value of the silicon layer thickness indicated by the peak of the frequency spectrum is determined to be unreliable.

While the above methods discussed with reference to FIG. 16 through FIG. 19 are applied to measurement of the silicon layer thickness using the infrared ray, these methods can also be applied to measurement of a film (e.g., a dielectric film such as $SiO_2$) on a substrate using visible light.

Figure 20:
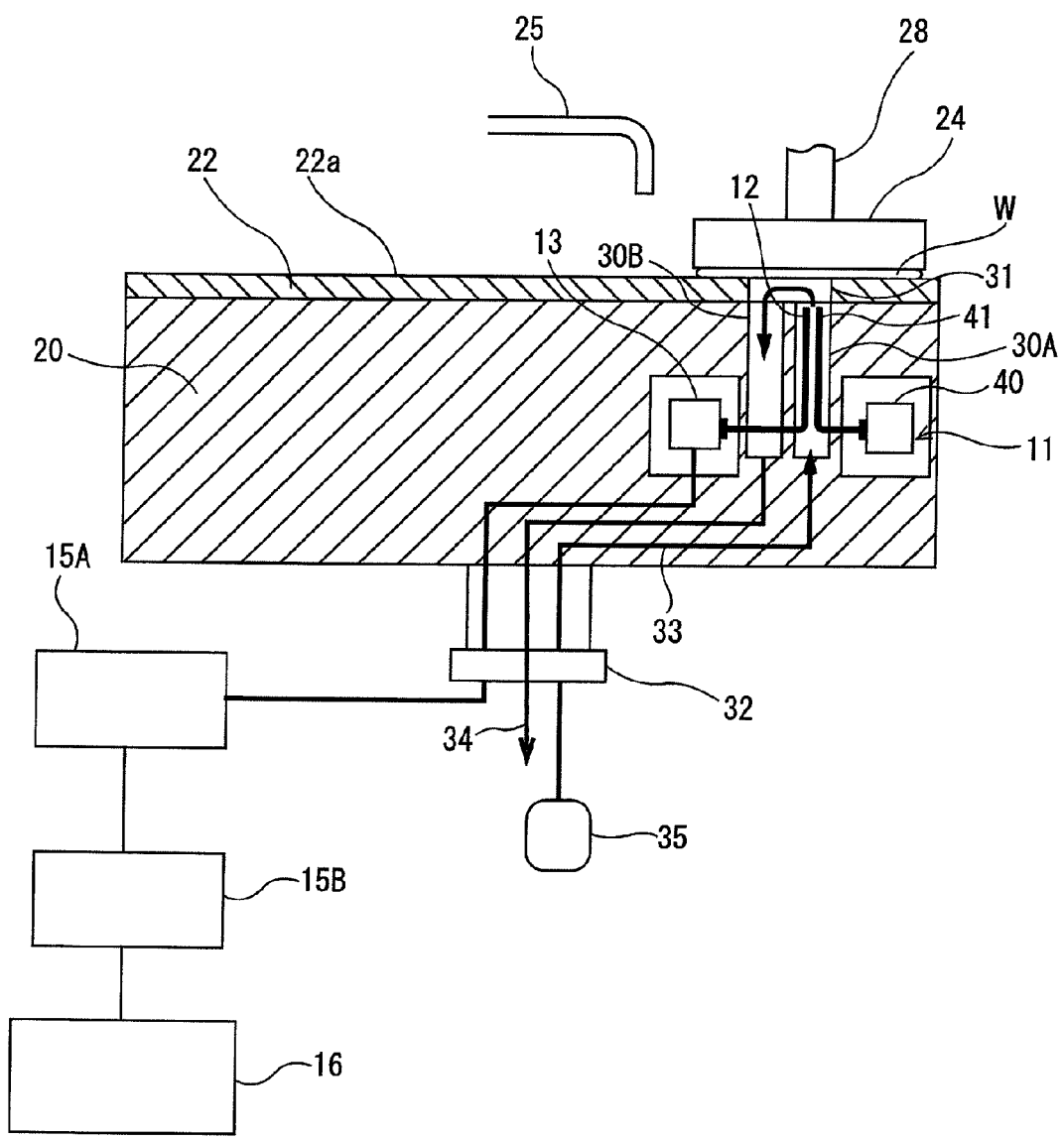
FIG. 20 is a cross-sectional view schematically showing a polishing apparatus.

FIG. 20 is a cross-sectional view schematically showing a polishing apparatus that can perform the above-discussed polishing end point detection methods. The polishing apparatus includes the polishing table 20 for supporting the polishing pad 22 thereon, a top ring 24 configured to hold the wafer W and press the wafer W against the polishing pad 22, and a polishing liquid supply unit 25 configured to supply a polishing liquid (slurry) onto the polishing pad 22. The polishing table 20 is coupled to a motor (not shown in the drawing) provided below the polishing table 20, so that the polishing table 20 can rotate about its own axis. The polishing pad 22 is secured to an upper surface of the polishing table 20.

The polishing pad 22 has an upper surface 22a, which provides a polishing surface for polishing the wafer W. The top ring 24 is coupled to a motor and an elevating cylinder (not shown in the drawing) through a top ring shaft 28. With these configurations, the top ring 24 can move in the vertical direction and can rotate about the top ring shaft 28. The top ring 24 has a lower surface which is configured to hold the wafer W by vacuum suction or the like.

The wafer W, held on the lower surface of the top ring 24, is rotated by the top ring 24, and is pressed by the top ring 24 against the polishing surface 22a of the polishing pad 22 on the rotating polishing table 20. Simultaneously, the polishing liquid is supplied onto the polishing surface 22a of the polishing pad 22 from the polishing liquid supply unit 25. The surface of the wafer W is polished in the presence of the polishing liquid between the surface of the wafer W and the polishing pad 22. A relative movement mechanism for providing sliding contact between the wafer W and the polishing pad 22 is constructed by the polishing table 20 and the top ring 24.

The polishing table 20 has a first hole 30A and a second hole 30B each having an upper open end lying in the upper surface of the polishing table 20. The polishing pad 22 has a through-hole 31 at a position corresponding to the holes 30A and 30B. The holes 30A and 30B are in fluid communication with the through-hole 31, which has an upper open end lying in the polishing surface 22a. The first hole 30A is coupled to a liquid supply source 35 via a liquid supply passage 33 and a rotary joint 32. The second hole 30B is coupled to a liquid discharge passage 34.

During polishing of the wafer W, the liquid supply source 35 supplies water (preferably pure water) as a transparent liquid into the first hole 30A. The water fills a space formed between the lower surface of the wafer W and tip ends of optical fibers 12 and 41. The water further flows into the second hole 30B and is expelled through the liquid discharge passage 34. The polishing liquid is discharged together with the water and thus a path of light is secured. The liquid supply passage 33 is provided with a valve (not shown in the drawing) configured to operate in conjunction with the rotation of the polishing table 20. The valve operates so as to stop the flow of the water or reduce the flow of the water when the wafer W is not located over the through-hole 31. In this embodiment, the liquid supply source 35 and the liquid supply passage 33 serve as a water supply mechanism.

The polishing apparatus has a polishing monitoring unit for monitoring the progress of the polishing process and detecting the polishing end point according to the above-discussed method. This polishing monitoring unit includes: the irradiator 11 for irradiating the surface, to be polished, of the wafer W with the infrared ray; the optical fiber 12 as the optical receiver for receiving the infrared ray reflected from the wafer W; the spectroscope 13 configured to resolve the reflected infrared ray according to the wavelength and measure the intensity of the reflected infrared ray over a predetermined wavelength range; the first processor 15A configured to determine the thickness of the silicon layer from the infrared-ray intensity data obtained by the spectroscope 13; and the second processor 15B configured to monitor the thickness of the silicon layer obtained from the first processor 15A and determine the polishing end point of the wafer W (i.e., the polishing end point of the silicon layer). The first processor 15A and the second processor 15B may be provided as one processor.

The irradiator 11 includes a light source 40 and the optical fiber 41 coupled to the light source 40. The optical fiber 41 is an optical transmission element for directing the infrared ray, emitted from the light source 40, to the surface of the wafer W. The tip ends of the optical fiber 41 and the optical fiber 12 are arranged in the first hole 30A and are located near the surface, to be polished, of the wafer W. The tip ends of the optical fiber 41 and the optical fiber 12 are arranged so as to face the center of the wafer W held by the top ring 24, so that multiple regions, including the center of the wafer W, are irradiated with the infrared ray each time the polishing table 20 makes one revolution as shown in FIG. 3 and FIG. 6. The infrared ray in the range of 800 nm to 900 nm can travel through the water relatively easily. Therefore, it is preferable to use near infrared ray.

A light emitting diode (LED) can be used as the light source 40. The infrared ray to be emitted from the light source 40 is preferably the near infrared ray having the wavelength in the range of 920 nm to 980 nm. Since the near infrared ray in this wavelength range is hardly absorbed into the water as compared with infrared ray having longer wavelength, more precise measurement can be realized. The optical fiber 41 and the optical fiber 12 are arranged in parallel with each other. The tip ends of the optical fiber 41 and the optical fiber 12 are approximately perpendicular to the surface of the wafer W, so that the optical fiber 41 directs the infrared ray to the surface of the wafer W perpendicularly.

During polishing of the wafer W, the irradiator 11 irradiates the wafer W with the infrared ray, and the optical fiber 12 receives the infrared ray reflected from the wafer W. During the irradiation, the water is supplied into the holes 30A and 30B and the through-hole 31 to fill the space between the surface of the wafer W and the tip ends of the optical fibers 41 and 12. The spectroscope 13 measures the intensity of the reflected infrared ray over the predetermined wavelength range and sends the infrared-ray intensity data to the first processor 15A, which performs the FFT (fast Fourier transform) process on the spectral waveform as described above to determine the thickness of the silicon layer. The second processor 15B determines the polishing end point based on the thickness of the silicon layer obtained from the first processor 15A.

Figure 21:
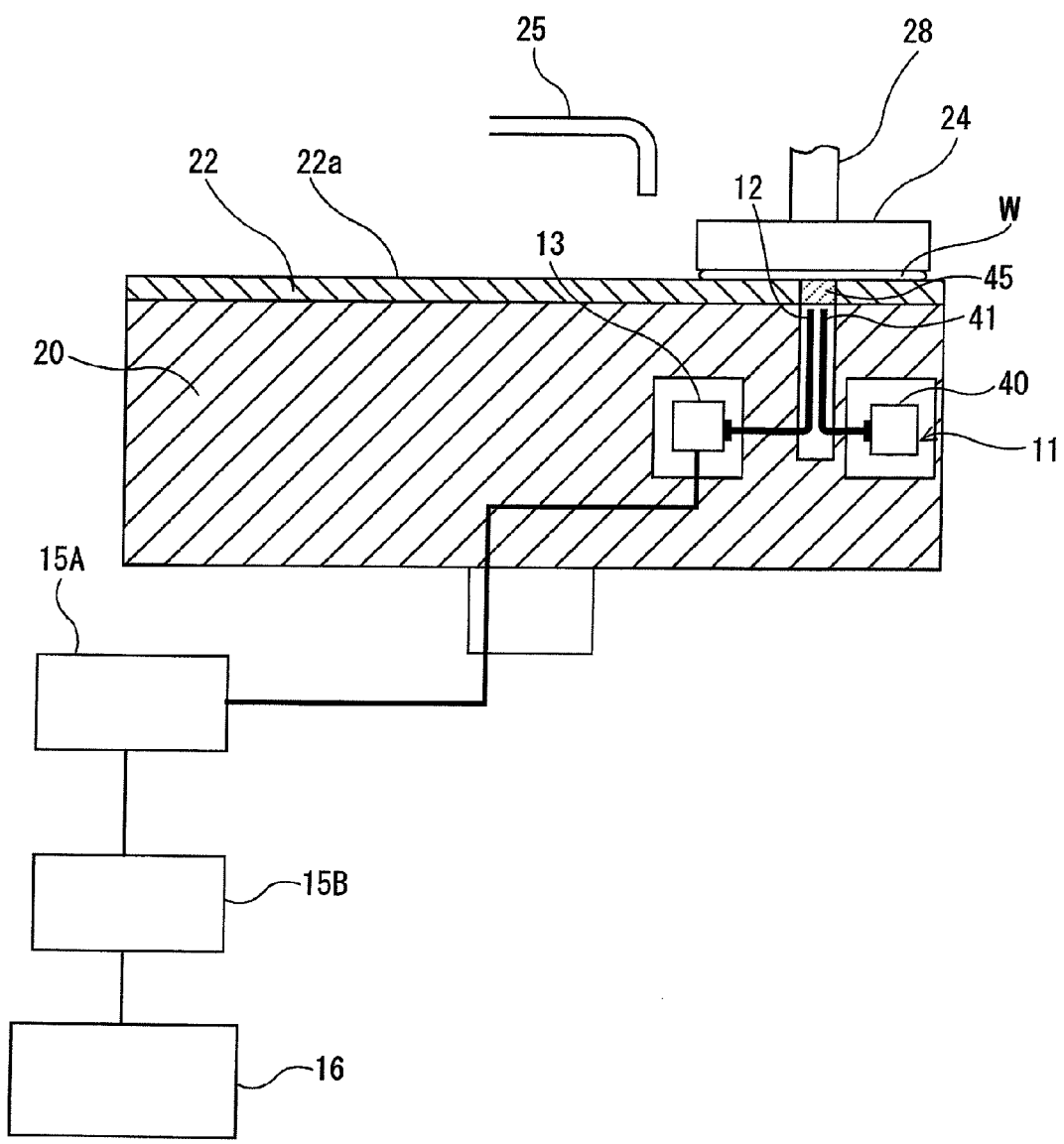
FIG. 21 is a cross-sectional view of a modified example of the polishing apparatus shown in FIG. 20.

FIG. 21 is a cross-sectional view showing a modified example of the polishing apparatus shown in FIG. 20. In the example shown in FIG. 21, the liquid supply passage, the liquid discharge passage, and the liquid supply source are not provided. Instead, a transparent window 45 is provided in the polishing pad 22. The optical fiber 41 of the irradiator 11 directs the infrared ray to the surface of the wafer W on the polishing pad 22 through the transparent window 45, and the optical fiber 12 as the optical receiver receives the infrared ray reflected from the wafer W through the transparent window 45. The other structures are the same as those of the polishing apparatus shown in FIG. 20.

The above-described silicon layer may be a silicon substrate itself. The present invention is applicable to polishing (or grinding) of the silicon substrate itself. For example, the present invention can be applied to a process of grinding a back-side surface of the silicon substrate. An apparatus for polishing (or grinding) the silicon substrate uses a bonded abrasive (or grinding stone) as the polishing tool, instead of the polishing pad 22.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A method of polishing a substrate having a silicon layer, said method comprising:
    polishing the substrate by pressing the substrate against a polishing tool on a rotating polishing table;
    irradiating the substrate with only a near infrared ray having a plurality of wavelengths in a range of 800 nm to 1000 nm when polishing the substrate;
    receiving the near infrared ray reflected from the substrate;
    measuring intensity of the reflected near infrared ray at respective wavelengths;
    calculating relative reflectance by dividing the measured intensity of the reflected near infrared ray by predetermined reference intensity;
    producing a spectral waveform representing a relationship between the relative reflectance and wavelength of the reflected near infrared ray;
    performing a Fourier transform process on the spectral waveform to extract frequency components and corresponding strengths of the frequency components from the spectral waveform;
    converting the frequency components into thicknesses of the silicon layer using a predetermined relational expression;

producing a frequency spectrum that represents relationship between the thickness of the silicon layer and the strength of the frequency component corresponding to the thickness of the silicon layer;

determining a thickness of the silicon layer and a corresponding strength of frequency component from a peak of the frequency spectrum;

identifying the determined thickness of the silicon layer as a reliable measured value if the determined strength of the frequency component is higher than a predetermined threshold value; and determining a polishing end point of the substrate based on a point of time when the reliable measured value has reached a predetermined target value.

2. The method according to claim 1, further comprising:
repeating said irradiating of the substrate with only the near infrared ray, said receiving, said measuring, said calculating, said producing, said performing, said converting, said producing, said determining, and said identifying of the reliable measured value several times to obtain a plurality of reliable measured values; and calculating an average of the plurality of reliable measured values, wherein said determining of the polishing end point of the substrate comprises determining a polishing end point of the substrate based on a point of time when the average has reached the predetermined target value.

3. The method according to claim 2, further comprising:
calculating a moving average of the average, wherein said determining of the polishing end point of the substrate comprises determining a polishing end point of the substrate based on a point of time when the moving average has reached the predetermined target value.

4. The method according to claim 1, further comprising:
repeating said irradiating of the substrate with only the near infrared ray, said receiving, said measuring, said calculating, said producing, said performing, said converting, said producing, said determining, and said identifying of the reliable measured value several times to obtain a plurality of reliable measured values; and calculating a moving average of the plurality of reliable measured values, wherein said determining of the polishing end point of the substrate comprises determining a polishing end point of the substrate based on a point of time when the moving average has reached the predetermined target value.

5. The method according to claim 1, wherein:
said irradiating of the substrate comprises irradiating a central region of the substrate with only the near infrared ray when polishing the substrate; and the reliable measured value is a measured value of the thickness of the silicon layer in the central region of the substrate.

6. The method according to claim 1, wherein:
said irradiating of the substrate comprises irradiating a plurality of regions of the substrate with only the near infrared ray when polishing the substrate; and the reliable measured value is a measured value of the thickness of the silicon layer in at least one region preselected from the plurality of regions of the substrate.

7. The method according to claim 1, wherein the predetermined threshold value varies based on a plurality of reliable measured values that have been obtained previously.

8. The method according to claim 1, wherein said performing of the Fourier transform process on the spectral waveform to determine the thickness of the silicon layer and the corresponding strength of frequency component includes:

performing a Fourier transform process on the spectral waveform to obtain a frequency spectrum representing relationship between thickness of the silicon layer and strength of the frequency component;

irradiating a reference silicon wafer with only a near infrared ray and calculating relative reflectance of the near infrared ray reflected from the reference silicon wafer at respective wavelengths to thereby obtain a reference spectral waveform;

performing a Fourier transform process on the reference spectral waveform to obtain a reference frequency spectrum;

dividing the strength of the frequency component at each silicon layer thickness on the frequency spectrum by a corresponding strength of frequency component on the reference frequency spectrum to thereby correct the frequency spectrum; and determining the thickness of the silicon layer and the corresponding strength of the frequency component from the corrected frequency spectrum.

9. The method according to claim 1, wherein a quantity of the near infrared ray directed to the substrate is changed according to a condition of the silicon layer to be polished.

10. The method according to claim 1, wherein the silicon layer is a silicon layer forming a light receiving surface of a backside illumination image sensor.

11. The method according to claim 1, wherein the silicon layer is a silicon layer of a through-silicon via.

12. An apparatus for polishing a substrate having a silicon layer, said apparatus comprising:

a rotatable polishing table for supporting a polishing tool thereon;

a top ring configured to press the substrate against the polishing tool on said rotating polishing table;

an irradiator configured to irradiate the substrate with only a near infrared ray having a plurality of wavelengths in a range of 800 nm to 1000 nm when the substrate is held by said top ring;

an optical receiver configured to receive the near infrared ray reflected from the substrate;

a spectroscope configured to measure intensity of the reflected near infrared ray at respective wavelengths; and a polishing monitoring unit configured to determine a thickness of the silicon layer from infrared-ray intensity data obtained by said spectroscope, wherein said polishing monitoring unit is configured to
calculate relative reflectance by dividing the measured intensity of the reflected near infrared ray by predetermined reference intensity, produce a spectral waveform representing a relationship between the relative reflectance and wavelength of the reflected near infrared ray, perform a Fourier transform process on the spectral waveform to extract frequency components and corresponding strengths of the frequency components from the spectral waveform;

convert the frequency components into thicknesses of the silicon layer using a predetermined relational expression;

produce a frequency spectrum that represents relationship between the thickness of the silicon layer and the strength of the frequency component corresponding to the thickness of the silicon layer;
determine the thickness of the silicon layer and a corresponding strength of frequency component from a peak of the frequency spectrum,
identify the determined thickness of the silicon layer as a reliable measured value if the determined strength of the frequency component is higher than a predetermined threshold value, and
determine a polishing end point of the substrate based on a point of time when the reliable measured value has reached a predetermined target value.

13. The apparatus according to claim 12, wherein:
said apparatus is configured to repeat the irradiating of the substrate with only the near infrared ray, the receiving, the measuring, the calculating, the producing, the performing, the converting, the producing, the determining, and the identifying of the reliable measured value several times while said polishing table is making one revolution to obtain a plurality of reliable measured values; and
said polishing monitoring unit is configured to
calculate an average of the plurality of reliable measured values, and
determine the polishing end point of the substrate based on a point of time when the average has reached the predetermined target value.

14. The apparatus according to claim 13, wherein said polishing monitoring unit is configured to
calculate a moving average of the average, and
determine the polishing end point of the substrate based on a point of time when the moving average has reached the predetermined target value.

15. The apparatus according to claim 12, wherein:
said apparatus is configured to repeat the irradiating of the substrate with only the near infrared ray, the receiving, the measuring, the calculating, the producing, the performing, the converting, the producing, the determining, and the identifying of the reliable measured value several times to obtain a plurality of reliable measured values; and
said polishing monitoring unit is configured to
calculate a moving average of the plurality of reliable measured values, and
determine the polishing end point of the substrate based on a point of time when the moving average has reached the predetermined target value.

16. The apparatus according to claim 12, wherein:
said irradiator irradiates a central region of the substrate with only the near infrared ray; and
the reliable measured value is a measured value of the thickness of the silicon layer in the central region of the substrate.

17. The apparatus according to claim 12, wherein:
said irradiator irradiates a plurality of regions of the substrate with only the near infrared ray; and
the reliable measured value is a measured value of the thickness of the silicon layer in at least one region preselected from the plurality of regions of the substrate.

18. The apparatus according to claim 12, wherein the predetermined threshold value varies based on a plurality of reliable measured values that have been obtained previously.

19. The apparatus according to claim 12, wherein said polishing monitoring unit is configured to
perform the Fourier transform process on the spectral waveform to obtain a frequency spectrum representing relationship between thickness of the silicon layer and strength of the frequency component,
irradiate a reference silicon wafer with only a near infrared ray and calculating relative reflectance of the near infrared ray reflected from the reference silicon wafer at respective wavelengths to thereby obtain a reference spectral waveform,
perform a Fourier transform process on the reference spectral waveform to obtain a reference frequency spectrum,
divide the strength of the frequency component at each silicon layer thickness on the frequency spectrum by a corresponding strength of frequency component on the reference frequency spectrum to thereby correct the frequency spectrum, and
determine the thickness of the silicon layer and the corresponding strength of the frequency component from the corrected frequency spectrum.

20. The apparatus according to claim 12, wherein said irradiator is configured to be able to change a quantity of the near infrared ray directed to the substrate according to a condition of the silicon layer to be polished.

21. The apparatus according to claim 12, wherein the silicon layer is a silicon layer forming a light receiving surface of a backside illumination image sensor.

22. The apparatus according to claim 12, wherein the silicon layer is a silicon layer of a through-silicon via.

23. The apparatus according to claim 12, further comprising:
a water supply mechanism configured to supply water into a space between the substrate pressed against the polishing tool and tip ends of said irradiator and said optical receiver.

* * * * *